(12) United States Patent
Zhu et al.

(10) Patent No.: US 12,161,034 B2
(45) Date of Patent: *Dec. 3, 2024

(54) DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Yuanzhang Zhu, Beijing (CN); Ren Xiong, Beijing (CN); Qiang Tang, Beijing (CN); Guoqiang Wu, Beijing (CN); Fei Shang, Beijing (CN); Haijun Qiu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/448,859

(22) Filed: Aug. 11, 2023

(65) Prior Publication Data

US 2023/0397464 A1 Dec. 7, 2023

Related U.S. Application Data

(63) Continuation-in-part of application No. 17/599,045, filed as application No. PCT/CN2021/079991 on Mar. 10, 2021, now Pat. No. 11,775,110.

(30) Foreign Application Priority Data

Mar. 13, 2020 (CN) .......................... 202020318481.1
Jun. 5, 2020 (CN) .......................... 202010505842.8

(51) Int. Cl.
*H10K 59/131* (2023.01)

(52) U.S. Cl.
CPC .................................. *H10K 59/131* (2023.02)

(58) Field of Classification Search
CPC ............. H05K 1/144; H05K 2201/041; H05K 2201/042; H05K 2201/044;
(Continued)

(56) References Cited

U.S. PATENT DOCUMENTS

2017/0046004 A1* 2/2017 Choi ..................... G06F 3/0446
2021/0357074 A1 11/2021 Xu et al.

FOREIGN PATENT DOCUMENTS

CN 1532594 A 9/2004
CN 107992239 A 5/2018
(Continued)

OTHER PUBLICATIONS

China Patent Office, the first pre-trial notice dated May 28, 2020, for corresponding Chinese application.
(Continued)

*Primary Examiner* — Sanjiv D. Patel
(74) *Attorney, Agent, or Firm* — HOUTTEMAN LAW LLC

(57) ABSTRACT

The present disclosure provides a display apparatus, a display panel of which includes a panel chip; a second bonding region of a main circuit board is provided with second display terminals coupled with first display terminals and second touch control terminals coupled with first touch control terminals; each of segment touch control lines includes a first segment coupled between one second touch control terminal and one main connector in a first region, and a second segment coupled between a touch control chip and one main connector in a second region; a third region and a fourth region of a jumper connection circuit board are bonded with the first region and the second region respectively; the segment touch control lines are in one-to-one correspondence with jumper connection lines, each jumper connection line is coupled between one jumper connector in (Continued)

the third region and one jumper connector in the fourth region.

20 Claims, 10 Drawing Sheets

(58) Field of Classification Search
CPC ....... H05K 2201/048; H05K 2201/049; H10K 59/00–95; H10K 59/40; G06F 2203/041–04114; G06F 3/041–047
See application file for complete search history.

(56) References Cited

FOREIGN PATENT DOCUMENTS

| | | |
|---|---|---|
| CN | 109669575 A | 4/2019 |
| CN | 110831328 A | 2/2020 |
| CN | 210123550 A | 3/2020 |
| CN | 111142712 A | 5/2020 |
| CN | 211044880 U | 7/2020 |
| EP | 3920671 A2 | 12/2021 |
| JP | H05102621 A | 4/1993 |

OTHER PUBLICATIONS

WIPO, International Search Report mailed on Jun. 21, 2021.
China Patent Office, Office action issued on Dec. 8, 2022.
India Patent Office, Office action issued on Oct. 11, 2022.
European Patent Office, extended European patent search report issued on Jul. 17, 2023.
USPTO, Notice of Allowance issued on May 12, 2023.

* cited by examiner

DISPLAY APPARATUS

CROSS-REFERENCE TO RELATED APPLICATIONS

The present application is a Continuation-In-Part of U.S. patent application Ser. No. 17/599,045, filed Sep. 28, 2021, a National Phase application filed under 35 U.S.C. 371 as a national stage of PCT/CN2021/079991 filed on Mar. 10, 2021, claims the priority of Chinese Patent Application No. 202020318481.1, filed on Mar. 13, 2020, and Chinese Patent Application No. 202010505842.8, filed on Jun. 5, 2020, the contents of which are incorporated herein in their entirety by reference.

TECHNICAL FIELD

The present disclosure relates to the field of display technology, and particularly relates to a display apparatus.

BACKGROUND

A display panel may be bonded to a circuit board, and the circuit board is then coupled to a display signal source such as a motherboard, so that a display driving signal is introduced into the display panel through a lead line in the circuit board. For the display panel with a touch function, a touch signal may also be transmitted through the circuit board, so that the number of lead lines in the circuit board is further increased.

In order to avoid misconnection between the lead lines in the circuit board or an excessive density of the lead lines in the circuit board, the number of layers for wiring may need to be increased, thereby causing problems of cost increasing, yield reduction and the like.

SUMMARY

The present disclosure provides a display apparatus, including a display panel, a circuit board assembly and a first functional structure, where the circuit board assembly includes a main circuit board and a jumper connection circuit board; the display panel includes a substrate, a display structure arranged on the substrate; the display panel has a first bonding region, and a plurality of first display terminals electrically coupled with the display structure are arranged in the first bonding region; the main circuit board has a second bonding region, a connection region, a first region and a second region; the second bonding region is bonded with the first bonding region, and a plurality of second display terminals electrically coupled with the first display terminals respectively are arranged in the second bonding region; a plurality of main connectors are respectively arranged in the first region and the second region; the main circuit board includes a control chip for controlling the first functional structure, a plurality of display lines, a plurality of segment control lines, and a first connection terminal electrically connected with the first functional structure; each segment control line includes a first segment and a second segment, where the first segment is coupled between the first connection terminal and one of the main connectors in the first region, and the second segment is coupled between the control chip and one of the main connectors in the second region; at least a portion of the display lines are coupled between the second display terminals and the connection region, and intersect with a line connected between the first region and the second region; the jumper connection circuit board has a third region and a fourth region; the third region is bonded with the first region, and the fourth region is bonded with the second region; a plurality of jumper connectors electrically coupled with the main connectors in the first region respectively are arranged in the third region, and a plurality of jumper connectors electrically coupled with the main connectors in the second region respectively are arranged in the fourth region; the jumper connection circuit board includes a plurality of jumper connection lines which correspond to the segment control lines one by one; each jumper connection line is coupled between one of the jumper connectors in the third region and one of the jumper connectors in the fourth region, and two of the main connectors electrically coupled with such two jumper connectors are respectively coupled with the first segment and the second segment of one of the segment control lines; the main circuit board is a flexible circuit board; the jumper connection circuit board is a flexible circuit board.

In some implementations, the first connection terminal is arranged in the second bonding region, a second connection terminal electrically connected with the first functional structure is arranged in the first bonding region, and the first functional structure is electrically connected with the first connection terminal through the second connection terminal; or, the second connection terminal is arranged on the first functional structure, and the first functional structure is electrically connected with the first connection terminal through the second connection terminal.

In some implementations, the first functional structure is integrated in the display panel, or separated from the display panel, and the first functional structure is at least one of a touch control structure, a fingerprint identification structure, a near-field communication structure, a pressure sensing structure, or a health data collection structure In some implementations, the jumper connectors coupled to the jumper connection lines are active connectors; the jumper connection circuit board further includes a shielding ring, and the shielding ring surrounds the jumper connection lines and the active connectors.

In some implementations, at least one of the jumper connectors in the third region is a shielding connector coupled to the shielding ring, at least one of the jumper connectors in the fourth region is a shielding connector coupled to the shielding ring; or, at least one of the jumper connectors in the third region is a ground connector coupled to a ground terminal, at least one of the jumper connectors in the fourth region is a ground connector coupled to the ground terminal; or, at least one of the jumper connectors in the third region is a floating connector floating, at least one of the jumper connectors in the fourth region is a floating connector floating.

In some implementations, the jumper connection circuit board includes a first base layer, where a first conductive layer and a second conductive layer are respectively arranged on two sides of the first base layer; each jumper connector includes a first contact part arranged in the first conductive layer and a second contact part arranged in the second conductive layer, and the first contact part and the second contact part are coupled through a connection part in a through hole of the first base layer.

In some implementations, a surface of the first contact part away from the first base layer is of a pattern with an opening therein, and a surface of the second contact part away from the first base layer is of a pattern with an opening therein; the connection part is a hollow cylinder; the jumper connector is electrically coupled with the main connector through a soldering structure formed by melting solder in a hollow of the connection part.

In some implementations, the first contact part is farther away from the main circuit board than the second contact part, and a thickness of a part of the soldering structure between the second contact part and the main connector is greater than a thickness of any one of the first contact part, the second contact part and the main connector In some implementations, the surface of the first contact part away from the first base layer has a shape of a circular ring, the surface of the second contact part away from the first base layer has a shape of the circular ring, and the connection part is hollow cylindrical, and a surface of the main connector proximal to the first base layer has a shape of a circle; or, an outer edge of the surface of the first contact part away from the first base layer has a shape of a circle, an outer edge of the surface of the second contact part away from the first base layer has a shape of a circle, the opening in the pattern of the surface of the first contact part away from the first base layer is in a shape formed by two strips intersecting with each other, and the opening in the pattern of the surface of the second contact part away from the first base layer is in a shape formed by two strips intersecting with each other.

In some implementations, an outer edge of the surface of the first contact part away from the first base layer has a dimension different from that of an outer edge of the surface of the second contact part away from the first base layer.

In some implementations, a portion of the jumper connection lines are arranged in the first conductive layer, the rest of the jumper connection lines are arranged in the second conductive layer, the first conductive layer is provided with at least one shielding mesh, and the second conductive layer is provided with at least one shielding mesh; or, the jumper connection lines are all disposed in the first conductive layer, the second conductive layer is provided with a shielding layer at least at a position corresponding to the jumper connection lines, and the second conductive layer is closer to the main circuit board than the first conductive layer.

In some implementations, a part of the jumper connection circuit board provided with the third region and a part of the jumper connection circuit board provided with the fourth region are in an asymmetric structure.

In some implementations, the main circuit board further includes a plurality of direct-connection control lines, and each direct-connection control line is coupled between the control chip and the first connection terminal, the display panel includes a plurality of panel control lines for introducing control signals to the first functional structure; the number of the panel control lines is equal to a sum of the number of the segment control lines and the number of the direct-connection control lines.

In some implementations, the main circuit board includes a second base layer, and a third conductive layer and a fourth conductive layer are respectively disposed on two sides of the second base layer; the display lines are all arranged in the fourth conductive layer, the third conductive layer is provided with a shielding structure at least at positions corresponding to the display lines, and the third conductive layer is closer to the jumper connection circuit board than the fourth conductive layer; and/or, the segment control lines are all provided in one of the third conductive layer and the fourth conductive layer, or, a portion of the segment control lines are arranged in the third conductive layer, and the rest of the segment control lines are arranged in the fourth conductive layer.

In some implementations, the main circuit board has a device region; in the device region, a plurality of devices are arranged on a side of the main circuit board; the control chip is arranged on a side of the device region of the main circuit board provided with the devices; in the device region, a metal supporting layer is arranged on a side of the main circuit board opposite to the side provided with the devices, where a boundary of an orthographic projection of the metal supporting layer on the main circuit board exceeds a boundary of the device region.

In some implementations, in any one of the first region and the second region, the main connectors are arranged in an array, any two of the main connectors, which are respectively in different rows, in any two adjacent rows of the array are at different positions in a row direction, and any two of the main connectors, which are respectively in different columns, in any two adjacent columns of the array are at different positions in a column direction; in any one of the third region and the fourth region, the jumper connectors are arranged in an array, any two jumper connectors, which are respectively in different rows, in any two adjacent rows of the array are at different positions in the row direction, and any two jumper connectors, which are respectively in different columns, in any two adjacent columns of the array are at different positions in the column direction.

In some implementations, the display panel is an organic light emitting diode display panel; the display structure of the organic light emitting diode display panel includes a plurality of organic light emitting diodes; the first display terminals include a plurality of first positive display terminals for supplying power to positive electrodes of the organic light emitting diodes and a plurality of first negative display terminals for supplying power to negative electrodes of the organic light emitting diodes; the second display terminals electrically coupled with the first positive display terminals are second positive display terminals, and the second display terminals electrically coupled with the first negative display terminals are second negative display terminals; the display lines include a plurality of positive lines coupled with the second positive display terminals and a plurality of negative lines coupled with the second negative display terminals.

In some implementations, each first display terminal has a thickness less than that of the display structure.

In some implementations, the display panel includes data lines and panel control lines for introducing control signals into the first functional structure, and there is a first distance between the panel control lines and the data lines in a direction perpendicular to the substrate; there is a second distance between the jumper connection lines in the jumper connection circuit board and the display lines in the main circuit board in a direction perpendicular to the jumper connection circuit board; the first distance is less than the second distance.

In some implementations, the display panel includes data lines; the display lines of the main circuit board include data display lines for providing signals to the data lines; the number of the data lines is greater than the number of the data display lines.

DESCRIPTION OF EMBODIMENTS

Figure 1:
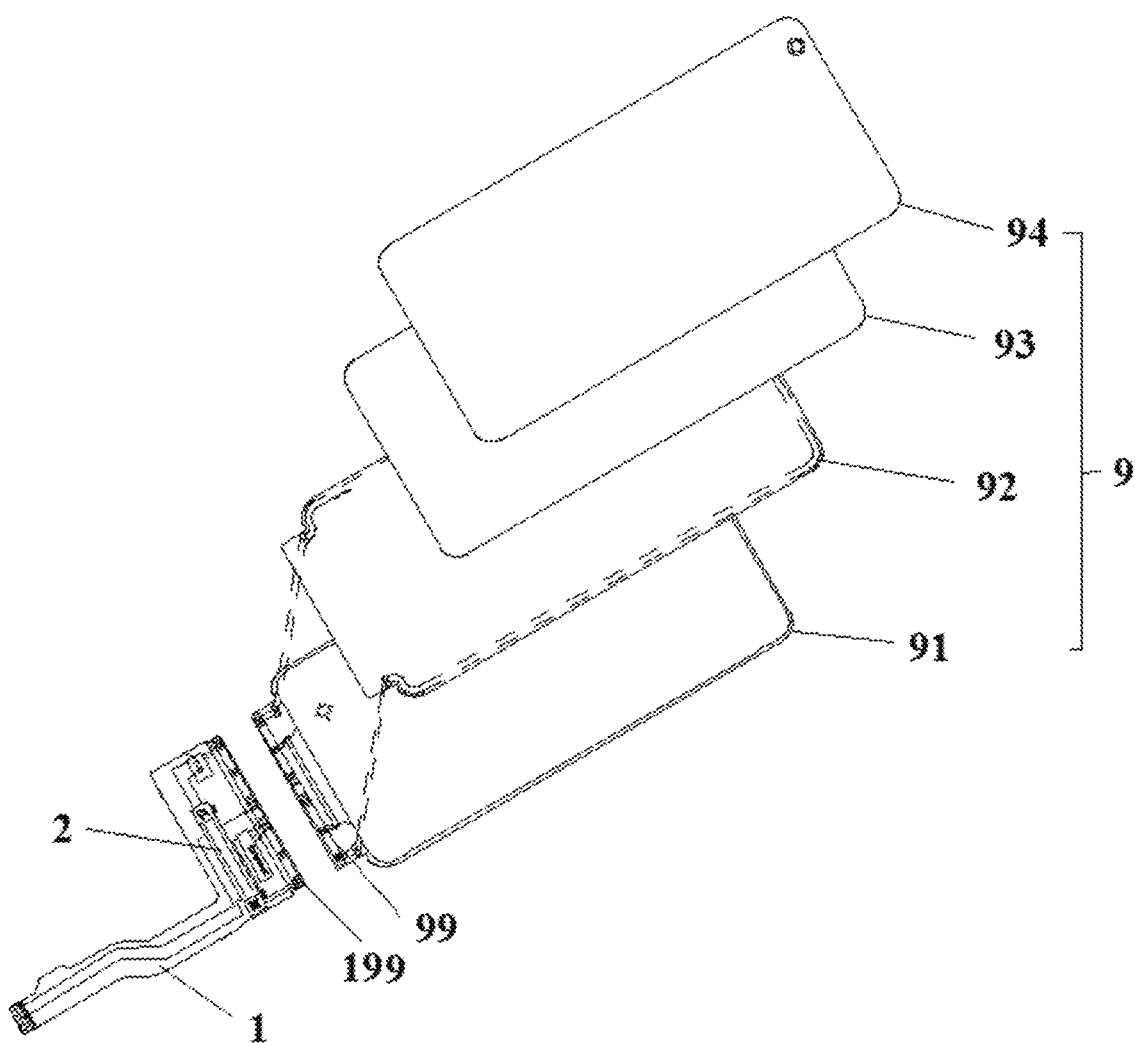
FIG. 1 is a schematic diagram of an explosive decomposition structure of a display apparatus according to an embodiment of the present disclosure (a main circuit board and a jumper connection circuit board are not separated).

In order that those skilled in the art will better understand technical solutions of the present disclosure, following detailed description is given with reference to the accompanying drawings and specific implementations.

It is to be understood that the specific implementations and drawings described herein are merely illustrative of the present disclosure and are not to be considered as limiting the present disclosure.

It is to be understood that various embodiments and features of the embodiments in the present disclosure may be combined with each other without conflict.

It is to be understood that, for convenience of description, only portions related to the present disclosure are shown in the drawings of the present disclosure, and portions not related to the present disclosure are not shown in the drawings.

In a first aspect, referring to FIGS. 1 to 16, an embodiment of the present disclosure provides a display apparatus.

The display apparatus of the embodiment of the present disclosure may be any product having a display function and a touch function, including but not limited to a mobile phone, a tablet computer, a television, a display, a notebook computer, a digital photo frame, an electronic paper, a navigator, and the like.

The display apparatus of the embodiment of the present disclosure includes a display panel 9 and a circuit board assembly Z, where the circuit board assembly Z includes a main circuit board 1 and a jumper connection circuit board 2; the display panel 9 includes a substrate, a display structure 91 disposed on the substrate, and a touch control structure 92 disposed on a side of the display structure 91 away from the substrate; the display panel 9 has a first bonding region 99, and a plurality of first display terminals 812 electrically coupled to the display structure 91 and a plurality of first touch control terminals 811 electrically coupled to the touch control structure 92 are provided in the first bonding region 99; the display panel 9 includes a panel chip 55; the main circuit board 1 has a second bonding region 199, a connection region 193, a first region 191, and a second region 192; the second bonding region 199 is bonded to the first bonding region 99, and a plurality of second display terminals 822 electrically coupled to the first display terminals 812 respectively and a plurality of second touch control terminals 821 electrically coupled to the first touch control terminals 811 respectively are provided in the second bonding region 199; a plurality of main connectors 5 are arranged in the first region 191 and the second region 192 respectively; the main circuit board 1 includes a touch control chip 4, a plurality of display lines 33 and a plurality of segment touch control lines 31; each segment touch control line 31 includes a first segment 311 and a second segment 312, where the first segment 311 is coupled between one of the second touch control terminals 821 and one of the main connectors 5 in the first region 191, and the second segment 312 is coupled between the touch control chip 4 and one of the main connectors 5 in the second region 192; at least a portion of the display lines 33 are coupled between the second display terminals 822 and the connection region 193, and intersect with a line connected between the first region 191 and the second region 192; the jumper connection circuit board 2 has a third region 291 and a fourth region 292; the third region 291 is bonded to the first region 191, and the fourth region 292 is bonded to the second region 192; a plurality of jumper connectors 6 electrically coupled to the main connectors 5 in the first region 191 are provided in the third region 291, and a plurality of jumper connectors 6 electrically coupled to the main connectors 5 in the second region 192 are provided in the fourth region 292; the jumper connection circuit board 2 includes a plurality of jumper connection lines 313 corresponding to the segment touch control lines 31 one-to-one; each jumper connection line 313 is coupled between one of the jumper connectors 6 in the third region 291 and one of the jumper connectors 6 in the fourth region 292, and two of the main connectors 5 electrically coupled to such two jumper connectors 6 are coupled to the first segment 311 and the second segment 312 of one of the segment touch control lines 31, respectively; the main circuit board 1 is a flexible circuit board; the jumper connection circuit board 2 is a flexible circuit board.

In the embodiment of the present disclosure, each "region" refers to a "region" having a certain area partitioned from a plate-shaped structure such as the display panel 9, the main circuit board 1, and the jumper connection circuit board 2, and each region may be provide with some structures therein, but the "region" itself is not a structure.

In the embodiment of the present disclosure, "electrically coupled" between A and B means that structures of A and B may allow an electrical signal to be transmitted therebetween, but does not represent that an electrical signal is necessarily transmitted between A and B; for example, both A and B may be floating, and even there is an electrical connection between A and B, no electrical signal is practically transmitted between A and B.

In the embodiment of the present disclosure, a line coupled between A and B means that the line can realize an electrical connection between A and B, but the line may also "pass through" other structures, or other structures may be provided on the line.

Referring to FIG. 1 (in which the substrate and the display structure 91 are shown integrally), the display panel 9 in the embodiment of the present disclosure is a device having a display function, which includes the display structure 91 provided on the substrate for realizing display. The display panel 9 further includes the touch control structure 92 directly formed on a side of the display structure 91 away from the substrate for implementing a touch function, and a signal from the touch control structure 92 is introduced through the first bonding region 99 of the display panel 9.

Thus, the display structure 91 and the touch control structure 92 are both located on the single substrate, rather than being located on two substrates respectively, so that the display panel 9 is of a "FMLOC (Flexible Multi-Layer On Cell) structure".

It should be understood that FIG. 1 merely illustrates that the display structure 91 and the touch control structure 92 are distinct functional layers and does not represent the display structure 91 and the touch control structure 92 are two separate layers; in practices, the touch control structure 92 may include a plurality of layer structures sequentially formed on the display structure 91.

The display panel 9 has the first bonding region 99, and the first display terminals 812 and the first touch control terminals 811, which are respectively provided for providing signals to the display structure 91 and the touch control structure 92, are disposed in the first bonding region 99, where each "terminal" is a bonding pin for bonding.

The display panel 9 is coupled to the circuit board assembly Z including the main circuit board 1 and the jumper connection circuit board 2.

Each of the main circuit board 1 and the jumper connection circuit board 2 is a flexible printed circuit (FPC). In such mode, both the main circuit board 1 and the jumper connection circuit board 2 can be deformed, and thus, on one hand, it is convenient to realize a bonding connection between the main circuit board 1 and the jumper connection circuit board 2; on the other hand, the main circuit board 1 and the jumper connection circuit board 2 may be bent to a back side of the display panel 9 to reduce a bezel of the display apparatus.

Certainly, although the flexible circuit board is taken as an example for description, it should be understood that a non-flexible circuit board may be employed in the embodiment of the present disclosure.

Figure 2:
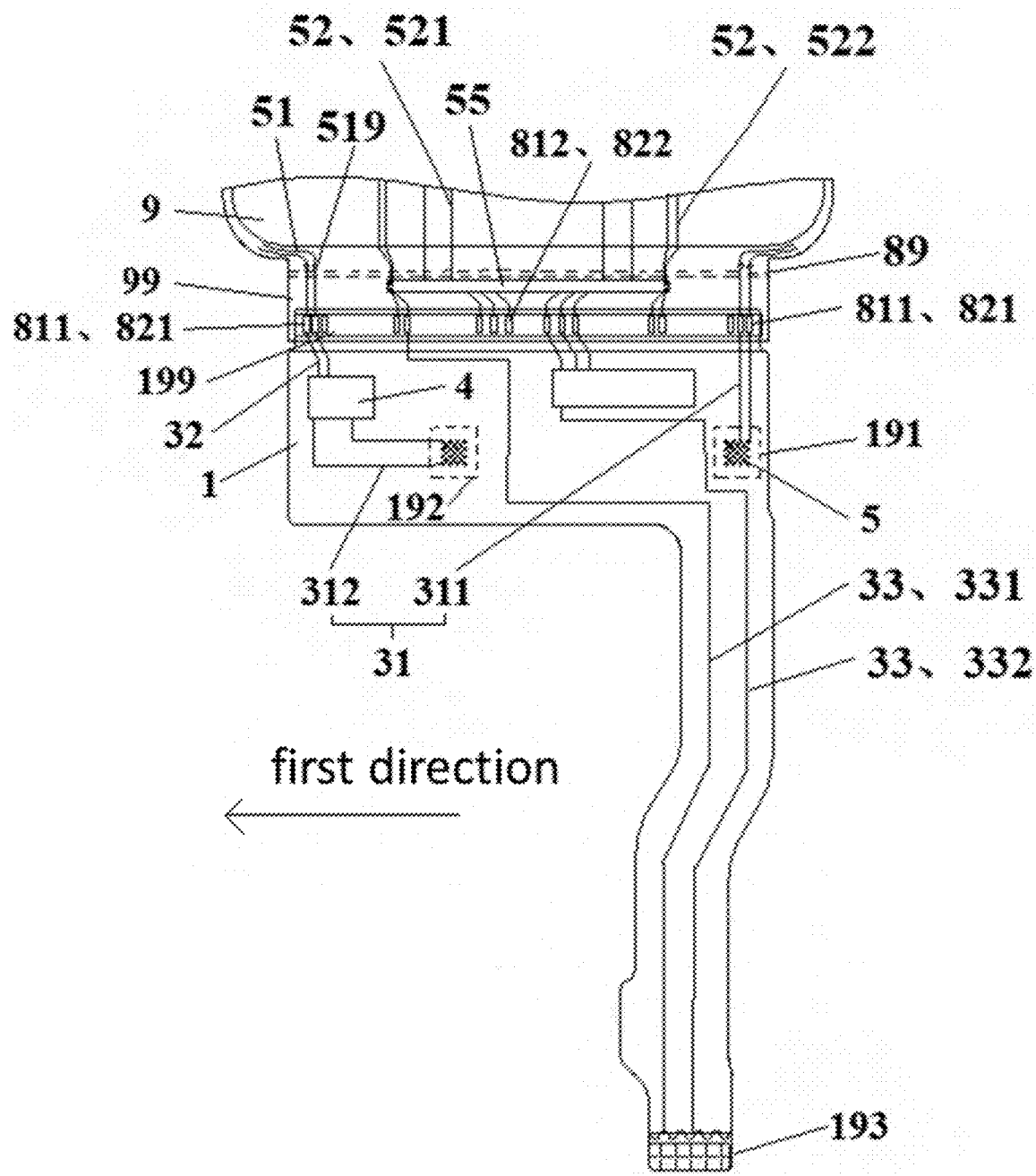
FIG. 2 is a partial top view of a structure of a display apparatus without a jumper connection circuit board according to an embodiment of the present disclosure.

Referring to FIG. 2, the second bonding region 199 of the main circuit board 1 (MFPC, Main FPC) is bonded to the first bonding region 99 of the display panel 9, the second display terminals 822 and the second touch control terminals 821 are provided in the second bonding region 199, and each of the second display terminals 822 and each of the second touch control terminals 821 are electrically coupled (certainly, physically coupled, i.e., bonded) to a corresponding one of the first display terminals 812 and a corresponding one of the first touch control terminals 811, respectively.

The second display terminals 822 are coupled to ends of the display lines 33 in one-to-one correspondence, and the other end of each of the display lines 33 is coupled to the connection region 193 (in particular, the connector) and coupled to a display signal source (e.g., a main board) through terminals (pins) in the connection region 193 or the like.

The main circuit board 1 is further provided with the touch control chip 4 (touch IC) for providing a touch signal, and at least a portion of the second touch control terminals 821 are coupled to the touch control chip 4 (in particular, pins of the touch control chip 4) through the segment touch control lines 31.

Referring to FIG. 2, each segment touch control line 31 includes two "segments" separated from each other, i.e., the first segment 311 and the second segment 312, where two ends of the first segment 311 are coupled to one of the main connectors 5 and one of the second touch control terminals 821, respectively, and two ends of the second segment 312 are coupled to another one of the main connectors 5 and the touch control chip 4 (in particular, one pin of the touch control chip 4), respectively. The main connectors 5 coupled to the first segments 311 are collectively distributed in the first region 191, and the main connectors 5 coupled to the second segments 312 are collectively distributed in the second region 192.

Meanwhile, referring to FIG. 2, the display lines 33 pass through a space between the first region 191 and the second region 192, so that if the main connectors 5 in the first region 191 and the main connectors 5 in the second region 192 are directly coupled by lead lines of the main circuit board 1 (in other words, the segment touch control line 31 is "not segmented"), the lead lines intersect with the display lines 33; in order to avoid misconnection between the lines intersected with each other, the number of layers of the main circuit board 1 needs to be increased, which results in problems of cost increasing, yield reduction and the like.

Figure 3:
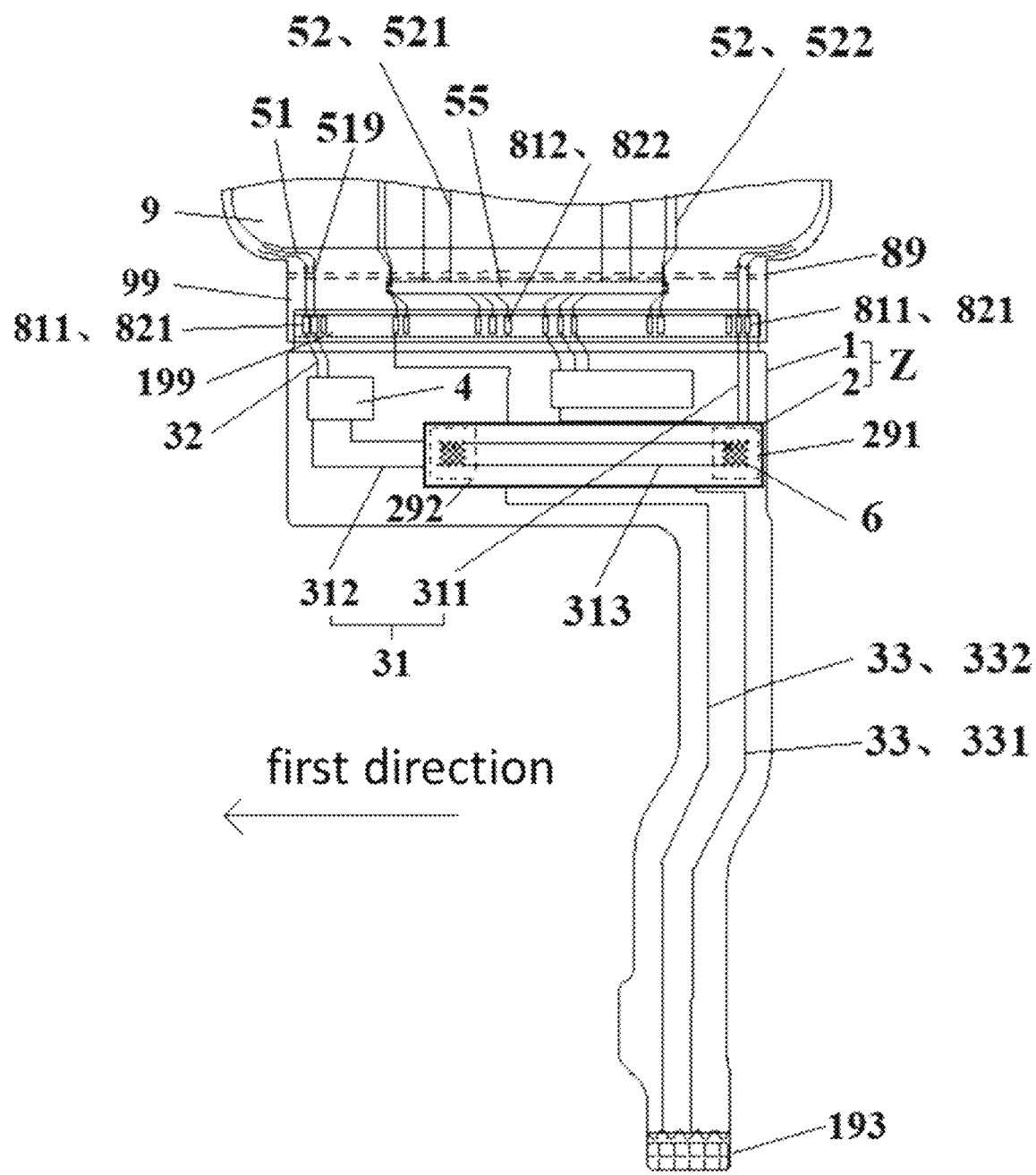
FIG. 3 is a partial top view of a structure of a display apparatus according to an embodiment of the present disclosure.

In the embodiment of the present disclosure, referring to FIG. 3, the first region 191 and the second region 192 are respectively bonded to the third region 291 and the fourth region 292 of the jumper connection circuit board 2, and specifically, the main connectors 5 in the first region 191 and the second region 192 are respectively electrically coupled (certainly, physically coupled) to the corresponding ones of the jumper connectors 6 in the third region 291 and the fourth region 292.

Further, the jumper connection circuit board 2 is provided with the plurality of jumper connection lines 313 corresponding to the segment touch control lines 31 one-to-one. The first segment 311 and the second segment 312 of each segment touch control line 31 connect two of the main connectors 5, and two of the jumper connectors 6, which are electrically coupled to the two of the main connectors 5 respectively, are coupled by the jumper connection line 313 corresponding to the segment touch control line 31.

That is to say, in the display apparatus according to the embodiment of the present disclosure, the touch signal is transmitted between the first region 191 and the second region 192 of the main circuit board 1 through the jumper connection line 313 on the jumper connection circuit board 2, and although the jumper connection line 313 crosses the display lines 33 in terms of position, but they belong to different circuit boards, so that they will not misconnect with each other although they cross, and thus the number of layers of the main circuit board 1 and the jumper connection circuit board 2 can be relatively small, which is convenient for reducing the cost (a sum of costs of two circuit boards each with a small number of layers is less than the cost of one multilayer circuit board) and improving the product yield.

In some implementations, the display structure 91 of the display panel 9 includes a plurality of panel display lines 52, such as data lines 521, a gate driving control line 522 for providing driving signals to a gate driving circuit (GOA), a power supply line 523 for providing power signals (e.g., a positive signal ELVDD, a negative signal ELVSS, etc.), and the like.

Different ones of the panel display lines 52 may correspond to different ones of the display lines 33 on the main circuit board 1, for example, may correspond to a data display line 331, a gate driving display line 332, a positive line 338, a negative line 339, respectively, or the like.

A portion of the display lines 33 are provided with high frequency signals, such as the signals in the data display lines 331, and the signals in some gate driving display lines 332, and these display lines 33 may be called "MIPI (Mobile Industry Processor interface) lines".

In some implementations, the panel chip 55 is further disposed on the display panel 9.

A portion of the panel display lines 52 may enter the panel chip 55 and then be led out to the first display terminals 812, and the number of the lines led out from the display panel 9 may be different from the number of the panel display lines 52, so that the corresponding number of the display lines 33 in the main circuit board 1 may also be different from the number of the panel display lines 52.

For example, the panel display lines 52 entering the panel chip 55 may include the data lines 521, the gate driving control line 522, and the like; and the power supply line 523 may not pass through the panel chip 55.

The panel chip 55 may be disposed on the substrate of the display panel 9, or disposed on a chip-on-film (COF) of the display panel 9, which will not be described in detail herein.

Accordingly, the display lines 33 on the main circuit board 1 may reach the connection region 193 after passing through some other structures, and for example, reach the connection region 193 after passing through a device in the device region 195 described later.

In some implementations, the touch signal in the touch control structure 92 may be led out to the first touch control terminal 811 through the panel touch control line 51, and the panel touch control line 51 may not be entirely located in one layer but include portions located in different layers and electrically coupled through a touch through hole 519.

In some implementations, the display panel 9 further includes a bending region 89 between the display region and the first bonding region 99, such as the bending region 89 between the touch through 519 and the panel chip 55.

With the bending region 89, the first bonding region 99 may be bent to the back side of the display region of the display panel to reduce the bezel.

In some implementations, the jumper connectors 6 coupled to the jumper connection lines 313 are active connectors 61; the jumper connection circuit board 2 further includes a shielding ring 251, the shielding ring 251 surrounding the jumper connection lines 313 and the active connectors 61.

In some implementations, there is at least one shielding connector 62, which is coupled to the shielding ring 251, in the jumper connectors 6 in the third region 291, and there is at least one shielding connector 62, which is coupled to the shielding ring 251, in the jumper connectors 6 in the fourth region 292.

Figure 4:
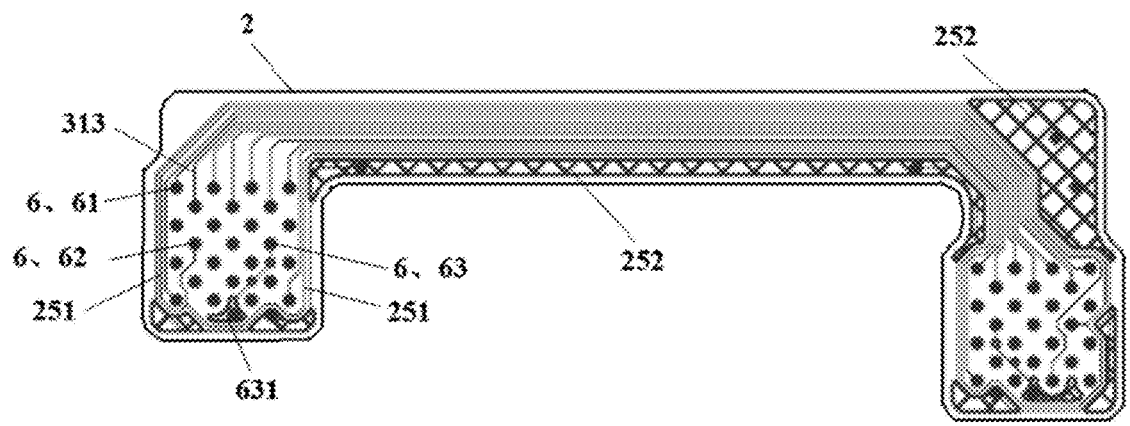
FIG. 4 is a schematic diagram of a conductive layer of a jumper connection circuit board in a display apparatus according to an embodiment of the present disclosure.
Figure 5:
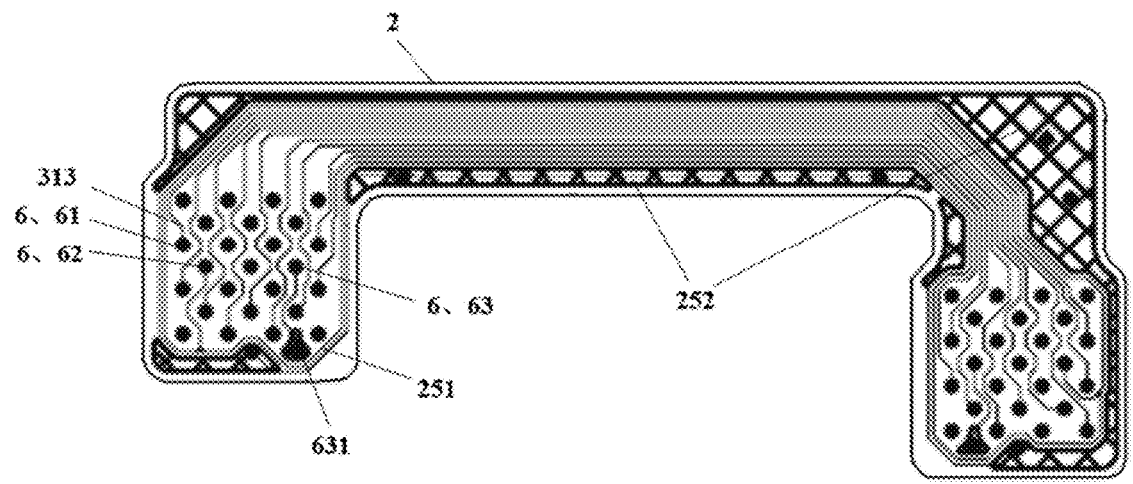
FIG. 5 is a schematic diagram of a conductive layer of a jumper connection circuit board in a display apparatus according to an embodiment of the present disclosure.
Figure 6:
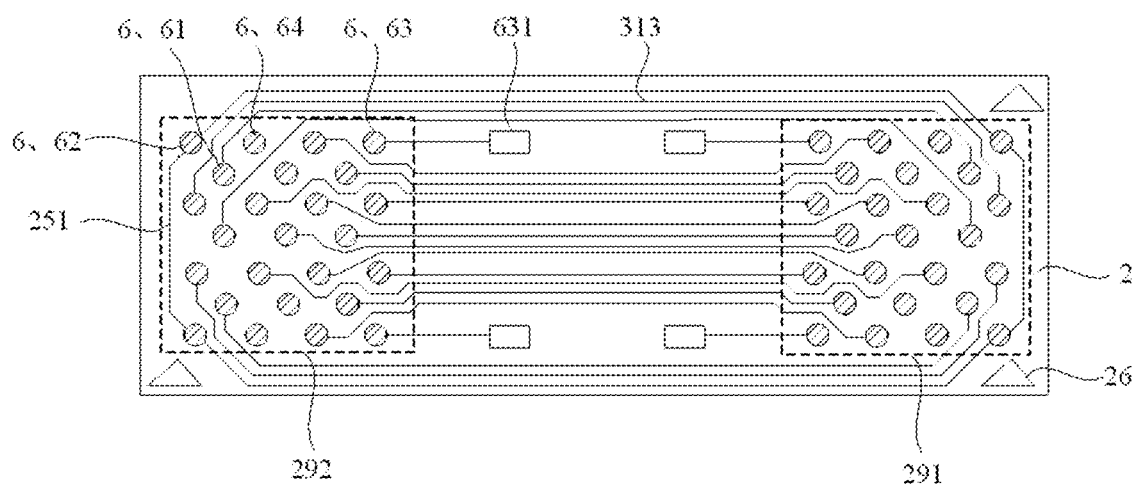
FIG. 6 is a schematic diagram of a first conductive layer of a jumper connection circuit board in a display apparatus according to an embodiment of the present disclosure.

Referring to FIGS. 4 to 6, the "shielding ring 251" being conductive may be formed on the jumper connection circuit board 2, the shielding ring 251 surrounding the jumper connection lines 313 and the corresponding ones of the jumper connectors 6 (i.e., the active connectors 61) inside, so that an influence of an external signal on a signal in the jumper connection line 313 may be shielded.

Further, there may be a portion of the jumper connectors 6 coupled with the shielding ring 251 to introduce a particular signal to the shielding ring 251 to improve a shielding effect.

Referring to FIGS. 4 and 5, the shielding connector 62 may be coupled to the shielding ring 251 by a lead line.

Referring to FIG. 6, the shielding connector 62 may be "directly located on the shielding ring 251", for example, two shielding connectors 62 in the third region 291 may be directly coupled, two shielding connectors 62 in the fourth region 292 may be directly coupled, then one of the shielding connectors 62 in the third region 291 is coupled with one of the shielding connectors 62 in the fourth region 292, and the other of the shielding connectors 62 in the third region 291 is coupled with the other of the shielding connectors 62 in the fourth region 292, which finally form the shielding ring 251.

It should be understood that, from the viewpoint of convenience, the shielding connectors 62 "directly on the shielding ring 251" above may be a connectors located at "outermost edges" of the respective regions, such as the two jumper connectors 6 uppermost and lowermost on the leftmost side and the two jumper connectors 6 uppermost and lowermost on the rightmost side in FIG. 6.

In some implementations, there is at least one ground connector 63, which is coupled to a ground terminal 631, in the jumper connectors 6 in the third region 291; there is at least one ground connector 63, which is coupled to the ground terminal 631, in the jumper connectors 6 in the fourth region 292.

Referring to FIGS. 4 to 6, in each of the third region 291 and the fourth region 292, there is the jumper connector 6 (i.e., the ground connector 63) coupled to the ground (i.e., the ground terminal 631) to further stabilize signals of the jumper connectors 6.

In some implementations, there is at least one floating connector 64 floating in the jumper connectors 6 in the third region 291; there is at least one floating connector 64 floating in the jumper connectors 6 in the fourth region 292.

Referring to FIG. 6, in the third region 291 and the fourth region 292, there may be some of the jumper connectors 6 (i.e., the floating connectors 64) which are not coupled (floating) at all, and these floating connectors 64 are only provided for bonding with the corresponding ones of the main connectors 5 (certainly, these main connectors 5 should also be floating) in the first region 191 and the second region 192, so as to improve a bonding effect and stabilize connections.

In some implementations, the jumper connection circuit board 2 includes a first base layer, and a first conductive layer and a second conductive layer are respectively disposed on two sides of the first base layer; each jumper connector 6 includes a first contact part 691 provided in the first conductive layer and a second contact part 692 provided in the second conductive layer, the first contact part 691 and the second contact part 692 being coupled by a connection part 693 in a through hole of the first base layer.

As a mode of the embodiment of the present disclosure, the jumper connection circuit board 2 may be a double-layer circuit board, which includes the first base layer made of plastic or the like and being insulated, and the first conductive layer and the second conductive layer made of a conductive material such as copper are respectively disposed on two sides of the first base layer.

It should be understood that the "conductive layer" refers to conductive structures located on a particular side of the base layer and does not represent that each conductive layer is a complete layer.

It should be understood that the number of layers of the "double-layer circuit board" is described with reference to the number of conductive layers therein, and does not represent the total number of layers of the circuit board, i.e., the circuit board may have other layer structures therein.

Figure 13:
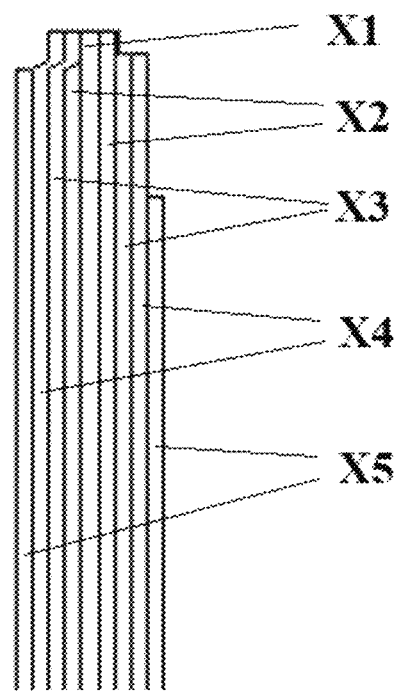
FIG. 13 is a cross-sectional view of a circuit board.

For example, referring to FIG. 13, the double-layer circuit board typically includes a base layer X1 of PI (polyimide) material, which may have a thickness ranging from 23 μm to 28 μm, for example, may be 25.4 μm; two conductive layers X2 of copper metal are respectively provided on two sides of the base layer X1, the conductive layers X2 each may have a thickness ranging from 12 μm to 16 μm, for example, may be 14 μm; two glue layers X3 are respectively provided on sides of the two conductive layers X2 away from the base layer X1, and the glue layers X3 each may have a thickness ranging from 13 μm to 17 μm, for example, may be 15 μm; two PI protective layers (Coverlay) X4 are respectively provided on sides of the two glue layers X3 away from the base layer X1, and the PI protective layers X4 each may have a thickness ranging from Hum to 14 μm, for example, may be 12.7 μm; two EMI (electromagnetic interference) layers X5 (for shielding) are respectively provided on sides of the two protective layers X4 away from the base layer X1, or only the side of one of the protective layers X4 away from the base layer X1 is provided with the EMI layer X5, and the EMI layer X5 may have a thickness ranging from 10 μm to 14 μm, for example, may be 12 μm.

Figure 9:
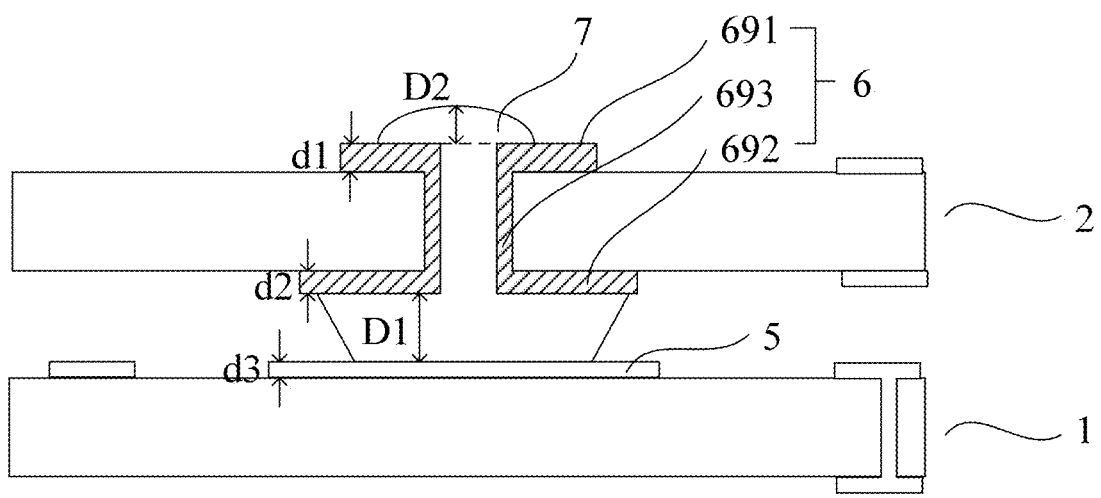
FIG. 9 is a partial cross-sectional view taken at a position of a jumper connector in a display apparatus according to an embodiment of the present disclosure.

Referring to FIG. 9, when the jumper connection circuit board 2 is a double-layer circuit board, the jumper connector 6 may simultaneously connect two conductive layers of the jumper connection circuit board 2, specifically, contact parts (the first contact part 691 and the second contact part 692) are respectively provided in the two conductive layers, and a through hole is formed in the first base layer between the two conductive layers, and the connection part 693 of a conductive material is formed in the through hole, so that the connection part 693 and the two contact parts (the first contact part 691 and the second contact part 692) jointly constitute the jumper connector 6.

In some implementations, a surface of first contact part 691 distal from the first base layer is of a pattern with an opening therein, and a surface of the second contact part 692 distal from the first base layer is of a pattern with an opening therein; the connection part 693 is a hollow cylinder; the jumper terminal 6 is electrically coupled to the main connector 5 by a soldering structure 7 formed by melting solder in a hollow of the connection part.

Figure 8:
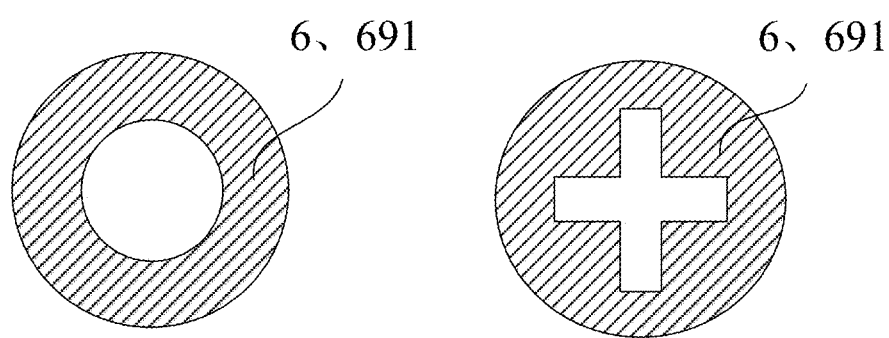
FIG. 8 is a partial top view of a structure of different jumper connectors in a display apparatus according to an embodiment of the present disclosure (no soldering structure is shown).

Referring to FIGS. 8 and 9, the connection part 693 is hollow cylindrical (i.e., the connection part 693 does not fully "fill" the through hole), and thus the first contact part 691 and the second contact part 692 are both hollowed.

Further, referring to FIG. 9 and FIGS. 14 to 16, the solder (e.g., tin solder) may be provided in the hollow in advance, and then the solder may be melted by heating through a process such as returning to a furnace, so that the melted solder forms the soldering structure 7 to electrically connect (certainly, physically connect, or bond) the jumper connector 6 with the main connector 5.

In some implementations, a surface of the first contact part 691 away from the first base layer is a circular ring, a surface of the second contact part 692 away from the first base layer is a circular ring, and the connection part 693 is hollow cylindrical.

Referring to FIGS. 8 and 9, the first contact part 691 and the second contact part 692 each may be a circular ring, that is, an outer edge thereof is circular and an inner opening thereof is circular.

In some implementations, an inner diameter of the circular ring ranges from 0.05 mm to 0.15 mm, and an outer diameter of the circular ring ranges from 0.25 mm to 0.35 mm; a surface of the main connector 5 proximal to the first base layer is a circle, and a diameter of the circle ranges from 0.25 mm to 0.35 mm.

Referring to FIG. 8, the inner diameter of the circular ring of each of the contact parts may range from 0.05 mm to 0.15 mm, and the outer diameter of the circular ring of each of the contact parts may range from 0.25 mm to correspondingly, the main connector 5 on the main circuit board 1 has a shape of a circle, and a diameter of the circle ranges from 0.25 mm to 0.35 mm.

In some implementations, an outer edge of a surface of the first contact part 691 away from the first base layer is circular; an outer edge of a surface of the second contact part 692 away from the first base layer is circular.

Referring to FIG. 8, the outer side of each of the contact parts may be circular.

In some implementations, the opening in the pattern of the surface of the first contact part 691 away from the first base layer has a shape formed by two strips intersecting with each other; the opening in the pattern of the surface of the second contact part 692 away from the first base layer has a shape formed by two stripes intersecting with each other.

Referring to FIG. 8, the internal opening of each of the contact parts has a shape formed by two strips intersecting with each other, for example, a shape of "X" or a shape of "+".

In some implementations, the outer dimension of the surface of the first contact part 691 away from the first base layer is different from the outer dimension of the surface of the second contact part 692 away from the first base layer.

Referring to FIG. 9, outer edges of two contact parts of each of the jumper connectors 6 may have different dimensions, for example, outer diameters of circular rings may be different, the outer diameter of one circular ring is larger and the outer diameter of the other circular ring is smaller, so that the soldering structure 7 can be formed into a desired shape to achieve better connection.

For example, the soldering structure 7 may include a "soldering cap" on a side of the jumper connector 6 away from the main connector 5, and a "soldering part" between the jumper connector 6 and the main connector 5, and specific forms of the soldering cap and the soldering part may be various.

For example, with reference to FIG. 9 and FIGS. 14 to 16, a portion of soldering structures 7 each have a soldering cap (a thickness D2 of which is generally less than 0.05 mm), while a portion of soldering structures 7 have almost no soldering cap; and for example, soldering caps of a portion of soldering structures 7 each are symmetrical left and right (based on a direction in the figure), and are substantially positioned in a middle of the ring; while soldering caps of a portion of soldering structures 7 may be significantly offset to left or right.

For example, referring to FIG. 9, and FIGS. 14 to 16, the "soldering part" of each of a portion of soldering structures 7 may be located substantially in the middle of the ring; while the "soldering part" of each of a portion of soldering structures 7 may be significantly offset to left or right.

Figure 14:
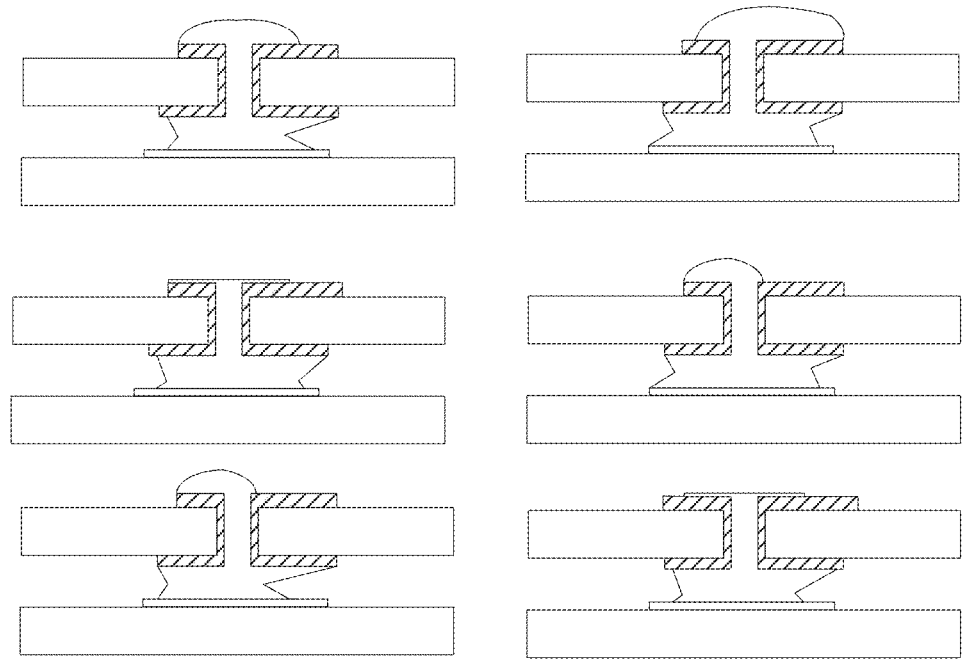
FIG. 14 is a partial cross-sectional view of a jumper connector in a display apparatus according to an embodiment of the present disclosure.
Figure 15:
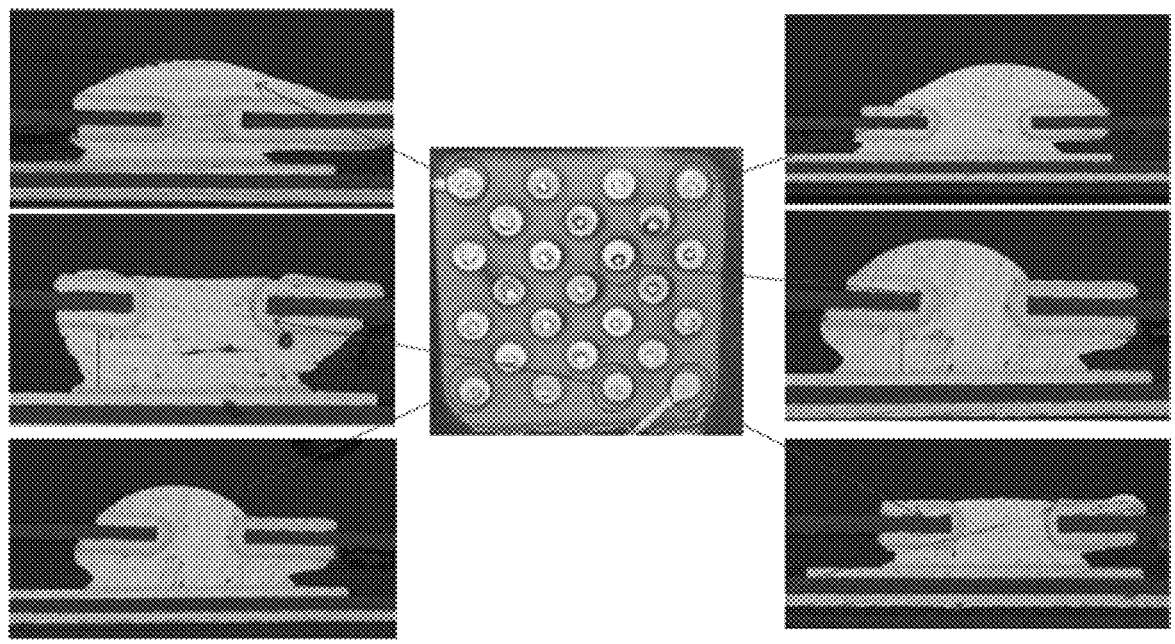
FIG. 15 is a partially enlarged photograph of a jumper connector in a display apparatus according to an embodiment of the present disclosure.
Figure 16:
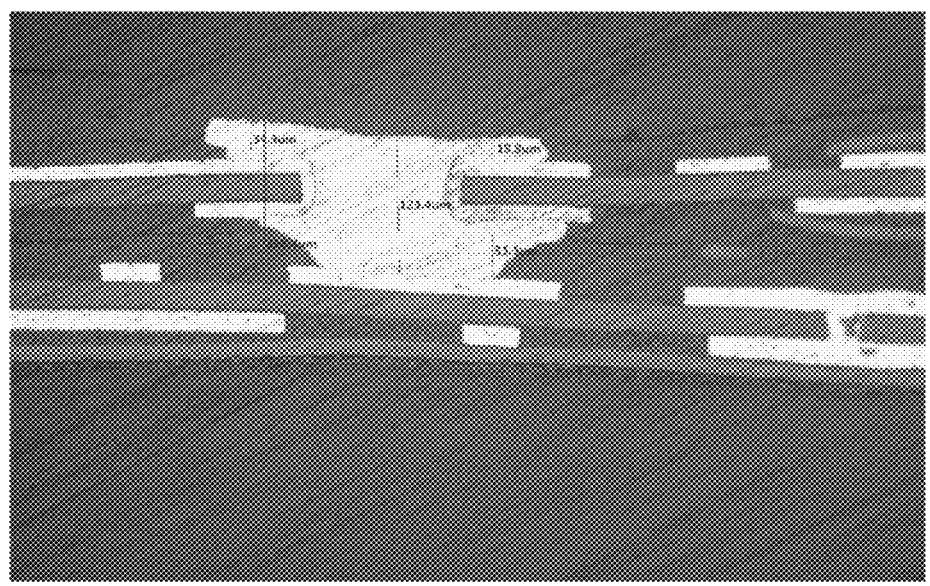
FIG. 16 is a partially enlarged photograph of a jumper connector in a display apparatus according to an embodiment of the present disclosure.

For example, referring to FIGS. 9, 14, and 15, in a direction in which the jumper connector 6 is directed toward the main connector 5, a width of the soldering part may be first reduced and then increased, that is, the soldering part is in a form of "thin middle and thick ends"; alternatively, further referring to FIG. 16, the width of the soldering part is continuously reduced in the direction in which the jumper connector 6 is directed toward the main connector 5.

At some positions around the jumper connectors 6 and the main connectors 5, thermosetting adhesive may be provided to directly bond and fix the circuit boards at positions without connectors, and a thickness of a layer of the adhesive may be about 5 μm.

At other positions of the main circuit board 1 and the jumper connection circuit board 2, a certain gap may be provided between the main circuit board 1 and the jumper connection circuit board 2, and other materials for isolation may also be filled in the gap.

Referring to FIGS. 9 and 16, the circuit boards each may be provided with other conductive structures (e.g., various lead lines) in addition to the jumper connectors 6 and the main connectors 5.

In some implementations, a portion of the jumper connection lines 313 are disposed in the first conductive layer, and the rest of the jumper connection lines 313 are disposed in the second conductive layer; the first conductive layer is provided with at least one shielding mesh 252, and the second conductive layer is provided with at least one shielding mesh 252.

As a mode of the embodiment of the present disclosure, referring to FIGS. 4 and 5, different ones of the jumper connection lines 313 may be respectively distributed in the first conductive layer and the second conductive layer, and such distribution is beneficial to reducing wiring density in each conductive layer, increasing a pitch between the lines, avoiding accidental short circuit, and reducing interference.

Referring to FIGS. 4 and 5, when both the first conductive layer and the second conductive layer are provided with the jumper connection lines 313, the shielding mesh 252 formed into a grid-shape and made of a conductive metal may be provided at a position of each conductive layer where there is no jumper connection line 313 and no jumper connector 6, so as to shield the influence of an external signal on the jumper connection lines 313.

Referring to FIGS. 4 and 5, when both the first conductive layer and the second conductive layer are provided with the jumper connection lines 313, the shielding ring 251 may be provided in each conductive layer.

In some implementations, all the jumper connection lines 313 are provided in the first conductive layer; the second conductive layer is provided with a shielding layer 253 at least at positions corresponding to the jumper connection lines 313; the second conductive layer is closer to the main circuit board 1 than the first conductive layer.

Figure 7:
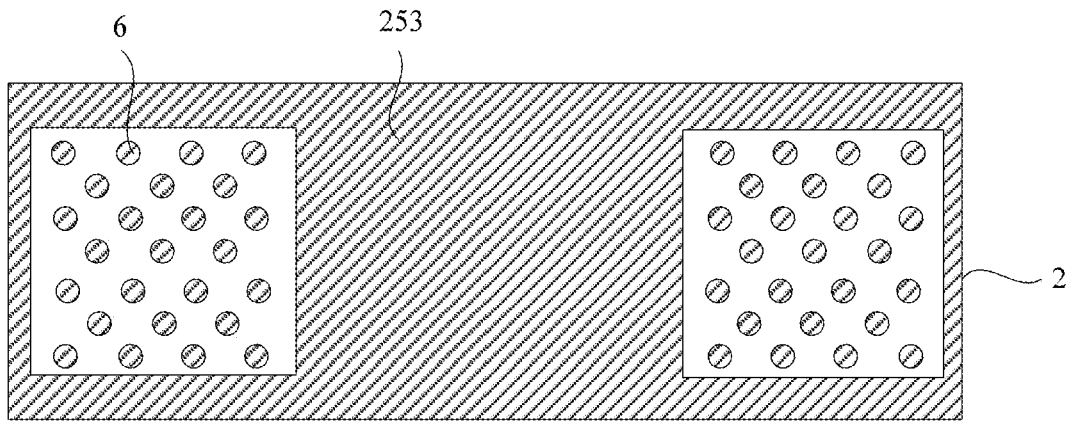
FIG. 7 is a schematic diagram of a second conductive layer of a jumper connection circuit board in a display apparatus according to an embodiment of the present disclosure.

As another mode of the embodiment of the present disclosure, referring to FIG. 6, the jumper connection lines 313 may be provided in one conductive layer (the first conductive layer); accordingly, referring to FIG. 7, the other conductive layer (the second conductive layer) may have the shielding layer 253 being integral (certainly, no shielding layer at positions corresponding to the jumper connectors 6), and the second conductive layer is closer to the main circuit board 1 than the first conductive layer, or the shielding layer 253 is located between the jumper connection lines 313 and the display lines 33.

Since many of the display lines 33 are loaded with high frequency signals (such as clock signals, data signals, etc.), they are liable to influence the signals in the jumper connection lines 313 due to coupling, and the above shielding layer 253 being integral can well shield the influence.

In some implementations, a part of the jumper connection circuit board 2 provided with the third region 291 and a part of the jumper connection circuit board 2 provided with the fourth region 292 are asymmetric.

That is, structures of both ends (an end provided with the third region 291 and an end provided with the fourth region 292) of the jumper connection line board 2 may be "asymmetric" (i.e., have a "fool-proof" design), so that an operator can distinguish the third region 291 from the fourth region 292 to avoid misconnections.

In some implementations, an asymmetric structure of the part of the jumper connection circuit board 2 provided with the third region 291 and the part of the jumper connection circuit board 2 provided with the fourth region 292 is realized by at least one of following modes: a conductive pattern in the part of the jumper connection circuit board 2 provided with the third region 291 and a conductive pattern in the part of the jumper connection circuit board 2 provided with the fourth region 292 are in an asymmetric structure; a shape of the part of the jumper connection circuit board 2 provided with the third region 291 and a shape of the part of the jumper connection circuit board 2 provided with the fourth region 292 are asymmetrical; a part of the jumper connection circuit board 2 provided with the third region 291 and a part of the jumper connection circuit board 2 provided with the fourth region 292 are provided with asymmetric optical marks 26.

The "asymmetric" structure at both ends of the jumper connection circuit board 2 may be achieved in many different specific modes.

For example, referring to FIGS. 4 and 5, specific conductive patterns (i.e., patterns formed by structures of the conductive layers) at both ends of the jumper connection circuit board 2 corresponding to the third region 291 and the fourth region 292 may be different in each conductive layer.

As another example, referring to FIGS. 4 and 5, the jumper connection circuit board 2 (the first base layer) itself may have an "asymmetric" shape at both ends thereof.

As another example, referring to FIG. 6, in the jumper connection line board 2, the specific conductive patterns in each conductive layer may be symmetrically distributed, but asymmetric "optical marks 26" are provided at the ends where the third region 291 and the fourth region 292 are located, for example, two optical marks 26 are provided at one end, and only one optical mark 26 is provided at the other end.

In some implementations, the main circuit board 1 further includes a plurality of direct-connection touch control lines 32, and each direct-connection touch control line 32 is coupled between the touch control chip 4 and one of the second touch control terminals 821.

Figure 11:
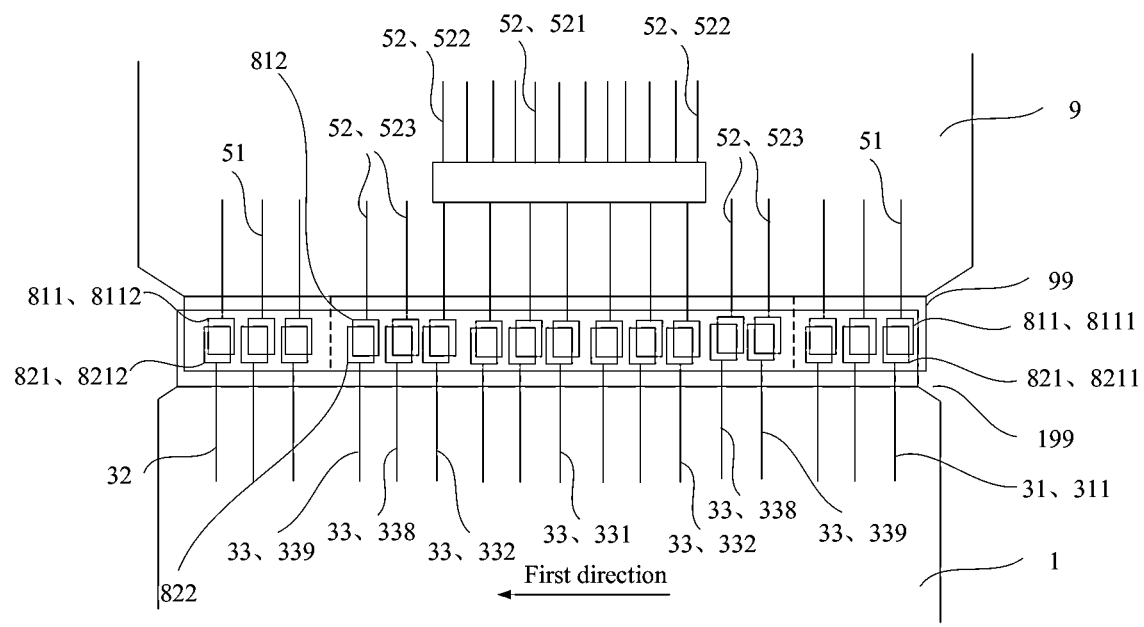
FIG. 11 is a partial top view at a position of bonding between a main circuit board and a display panel in a display apparatus according to an embodiment of the present disclosure.

Referring to FIGS. 2, 3, and 11, in the main circuit board 1, in addition to the segment touch control lines 31, there are also the direct-connection touch control lines 32, that is, touch control lines directly connecting the touch control chip 4 with the second touch control terminals 821, and these direct-connection touch control lines 32 do not intersect with the display lines 33, and thus they can be directly disposed.

In some implementations, the display panel 9 includes a plurality of panel touch control lines 51 for introducing touch signals into the first touch control terminals 811 respectively; the number of the panel touch control lines 51 is equal to a sum of the number of the segment touch control lines 31 and the number of the direct-connection touch control lines 32.

As mentioned above, the touch signals in the touch control structure need to be respectively introduced to the first touch control terminals 811 through the panel touch control lines 51, and thus the panel touch control lines 51 correspond to the first touch control terminals 811 one by one, and also correspond to touch electrodes (e.g., sensing electrodes and scanning electrodes) in the display panel one by one.

Accordingly, in the main circuit board 1, a total number of the touch control lines (the segment touch control lines 31 and the direct-connection touch control lines 32) should be the same as the number of the panel touch control lines 51.

In some implementations, the touch control structure 92 includes a plurality of sensing electrodes and a plurality of scanning electrodes overlapped and insulated; each of the sensing electrodes is electrically coupled with one of the first touch control terminals 811 (specifically, through one of the panel touch control lines 51), the first touch control terminals 811 electrically coupled with the sensing electrodes are first sensing touch control terminals 8112, and the second touch control terminals 821 electrically coupled with the first sensing touch control terminals 8112 are second sensing touch control terminals 8212; each of the scanning electrodes is electrically coupled to one of the first touch control terminals 811 (specifically, by one of the panel touch control lines 51), the first touch control terminals 811 electrically coupled to the scanning electrodes are first scanning touch control terminals 8111, and the second touch control terminals 821 electrically coupled to the first scanning touch control terminals 8111 are second scanning touch control terminals 8211; each of the direct-connection touch control lines 32 is coupled with one of the second sensing touch control terminals 8212; the first segment 311 of each of the segment touch control lines 31 is coupled with one of the second scanning touch control terminals 8211; in the second bonding region 199, along a first direction, the second scanning touch control terminals 8211, the second display terminals 822, and the second sensing touch control terminals 8212 are sequentially distributed; the first direction is parallel to a direction in which a width of the second bonding region 199 extends.

The touch control structure 92 in the display panel 9 may be formed by sensing electrodes (Rx) and scanning electrodes (Tx) which are overlapped. The scanning electrodes are applied with scanning signals in turn, so that a position of touch can be determined by detecting signals in the sensing electrodes.

Referring to FIGS. 2, 3, and 11, the touch control terminals (the second sensing touch control terminals 8212) electrically coupled to the sensing electrodes in the main circuit board 1 are coupled to the touch control chip 4 through the direct-connection touch control lines 32, and the touch control terminals (the second scanning touch control terminals 8211) electrically coupled to the scanning electrodes are coupled to the touch control chip 4 through the segment touch control lines 31.

Referring to FIGS. 2, 3, and 11, the first direction is the direction in which the width of the second bonding region 199 extends, that is, a direction in which different terminals (the touch control terminals and the display terminals) are sequentially arranged (for example, a direction from right to left in FIGS. 2, 3, and 11), the second bonding region 199 is first provided with the second scanning touch control terminals 8211, then the second display terminals 822, and then the second sensing touch control terminals 8212, that is, the second scanning touch control terminals 8211 are located at a "right end" of the main circuit board 1, the second display terminals 822 are located at a "middle part" of the main circuit board 1, and the second sensing touch control terminals 8212 are located at a "left end" of the main circuit board 1; accordingly, the second region 192 and the first region 191 are also located at left and right sides of the display lines 33, respectively.

Thus, referring to FIGS. 2 and 3, the circuit board may have a shape similar to a word "7", the second bonding region 199, the first region 191, the second region 192, etc. are located at a "horizontal part" of the word "7", the connection region 193 is located at a lower end of a "vertical part" of the word "7", and the display lines 33 extend downward from a middle of the second bonding region 199 to the connection region 193; the direct-connection touch control lines 32 (the touch control lines corresponding to the sensing electrodes) extend downward slightly from a left end of the second bonding region 199, i.e., are directly coupled to the touch control chip 4; the first segment 311 of the segment touch control line 31 (the touch control line corresponding to the scanning electrode) extends from a right end of the second bonding region 199 slightly downward into the first region 191 and is coupled to the main connector 5, and then crosses each display line 33 to be coupled to the second region 192 at left through the jumper connection line 313 of the jumper connection circuit board 2, and the second segment 312 of the segment touch control line 31 extends from the second region 192 slightly upward (or downward) and is coupled to the touch control chip 4.

The maximum width (i.e., the dimension in a direction parallel to the horizontal part of the word "7") of the main circuit board 1 may range from to 60 mm, for example, may be 55.4 mm±0.15 mm; a width of the second bonding region 199 may be slightly smaller, and may range from 50 mm to for example, may be 53.7 mm±0.15 mm, and a height of the second bonding region 199 (i.e., the dimension in a direction perpendicular to the horizontal part of the word "7") may range from 1 mm to 2 mm, for example, may be 1.4 mm±0.2 mm.

In some implementations, the touch control structure 92 includes a plurality of sensing electrodes and a plurality of scanning electrodes overlapped and insulated; each of the sensing electrodes is electrically coupled with one of the first touch control terminals 811 (specifically, through one of the panel touch control lines 51), the first touch control terminals 811 electrically coupled with the sensing electrodes are first sensing touch control terminals 8112, and the second touch control terminals 821 electrically coupled with the first sensing touch control terminals 8112 are second sensing touch control terminals 8212; each scanning electrodes is electrically coupled to one of the first touch control terminals 811 (specifically, by one of the panel touch control lines 51), the first touch control terminals 811 electrically coupled to the scanning electrodes are first scanning touch control terminals 8111, and the second touch control terminals 821 electrically coupled to the first scanning touch control terminals 8111 are second scanning touch control terminal 8211; each direct-connection touch control lines 32 is coupled with one of the second scanning touch control terminals 8211; the first segment 311 of each of the segment touch control lines 31 is coupled with one of the second sensing touch control terminals 8212; in the second bonding region 199, along a first direction, the second sensing touch control terminals 8212, the second display terminals 822, and the second scanning touch control terminals 8211 are sequentially distributed; the first direction is parallel to a direction in which a width of the second bonding region 199 extends.

As another mode of the embodiment of the present disclosure, the second scanning touch control terminal 8211 may be directly coupled to the touch control chip 4 through the direct-connection touch control line 32, and the second sensing touch control terminal 8212 is coupled to the touch control chip 4 through the segment touch control line 31.

Certainly, in such case, the second scanning touch control terminal 8211 is closer to the touch control chip 4, and the second sensing touch control terminal 8212 is farther away from the touch control chip 4.

The main circuit board 1 may include a second base layer, and a third conductive layer and a fourth conductive layer may be provided on two sides of the second base layer respectively.

That is, the main circuit board 1 may be in a form of a double-layer circuit board.

In some implementations, the display lines 33 are disposed in the fourth conductive layer; the third conductive layer is provided with a shielding structure at least at positions corresponding to the display lines 33; the third conductive layer is closer to the jumper connection circuit board 2 than the fourth conductive layer.

When the main circuit board 1 is a double-layer circuit board, the display lines 33 may be located in the conductive layer (the fourth conductive layer) farther from the patch circuit board 2, and correspondingly, in another conductive layer (the third conductive layer) closer to the jumper connection circuit board 2, a shielding structure (such as a layered structure or a mesh structure) may be provided at positions corresponding to the display lines 33, and the shielding structure may further shield the influence of the display lines 33 (especially, the display lines 33 transmitting high frequency signals) on the jumper connection lines 313 in the jumper connection circuit board 2.

In some implementations, the segment touch control lines 31 are all provided in one of the third conductive layer and the fourth conductive layer.

As another mode of the embodiment of the present disclosure, all the segment touch control lines 31 may be located in a same conductive layer.

In some implementations, a portion of the segment touch control lines 31 are provided in the third conductive layer, and the rest of the segment touch control line 31 are provided in the fourth conductive layer.

As a mode of the embodiment of the present disclosure, different segment touch control lines 31 may be respectively located in different conductive layers to reduce wiring density in each conductive layer.

In some implementations, the main circuit board 1 has a device region 195; in the device region 195, a plurality of devices are provided on a side of the main circuit board 1; the touch control chip 4 is arranged on the side of the device region 195 of the main circuit board 1, which is provided with a device; in the device region 195, a metal supporting layer 1951 is provided on a side of the main circuit board 1, which is opposite to the side on which the device is provided.

That is, the main circuit board 1 further has the device region 195 for disposing a large number of additional devices (such as capacitors, etc.), and simultaneously, the touch control chip 4 is also located in the device region 195 (because the touch control chip 4 is also a device).

For example, referring to FIG. 10, as a mode of the embodiment of the present disclosure, there may be two device regions 195, which may be located below the second bonding region 199, and the first region 191 and the second region 192, etc. are located below the device regions 195.

When the device region 195 is provided, the devices, the touch control chip 4, and the lines (the direct-connection touch control lines 32, the segment touch control lines 31, the display lines 33, etc.) in the device region 195 may be located on a same side of the main circuit board 1 (i.e., in the same conductive layer), and the other side of the device region 195 is provided with an integral metal layer (the metal supporting layer 1951) with a larger thickness, so that with the metal supporting layer 1951, a portion of the main circuit board 1 in the device region 195 has higher strength, and various devices disposed therein are protected.

In some implementations, a boundary of an orthographic projection of the metal supporting layer 1951 on the main circuit board 1 exceeds a boundary of the device region 195 by at least 0.5 mm.

Figure 10:
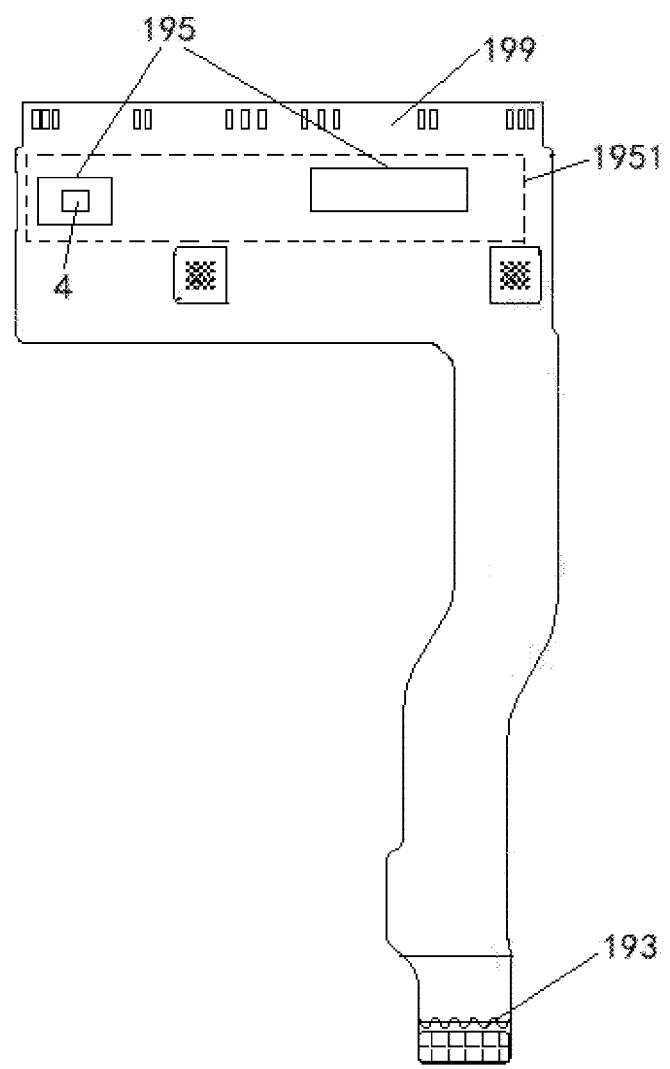
FIG. 10 is a schematic diagram of a part region of a main circuit board in a display apparatus according to an embodiment of the present disclosure.

To ensure supporting effect, referring to FIG. 10, the metal supporting layer 1951 may be "larger" than the device region 195 by at least (or more) at each side edge; for example, referring to FIG. 10, two device regions 195 may correspond to one larger metal supporting layer 1951.

In some implementations, in any one of the first region 191 and the second region 192, the main connectors 5 are arranged in an array, in any two adjacent rows of the array, any two main connectors 5 respectively belonging to different rows are at different positions in a row direction, and in any two adjacent columns of the array, any two main connectors 5 respectively belonging to different columns are at different positions in a column direction; in any one of the third region 291 and the fourth region 292, the jumper connectors 6 are arranged in an array, in any two adjacent rows of the array, any two jumper connectors 6 respectively belonging to different rows are at different positions in a row direction, and in any two adjacent columns of the array, any two jumper connectors 6 respectively belonging to different columns are at different positions in a column direction.

Figure 12:
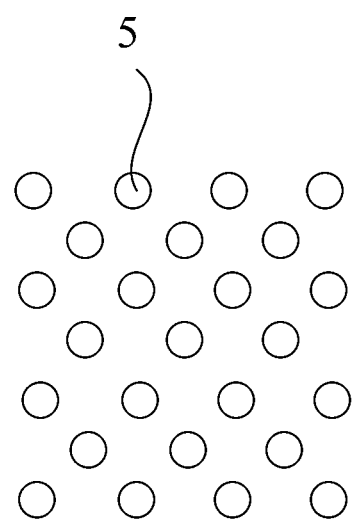
FIG. 12 is a schematic diagram illustrating a distribution of main connectors in a region of a main circuit board in a display apparatus according to an embodiment of the present disclosure.

Referring to FIGS. 6, 7 and 12, the connectors (the main connectors or the jumper connectors 6) in each region (the first region 191, the second region 192, the third region 291, the fourth region 292) may be arrayed in rows and columns; furthermore, adjacent row s/columns are "staggered", and thus for each connector, it is not aligned with any other connector, in the row/column adjacent thereto, in the row/column direction, which facilitates connections between the connectors inside the array and the corresponding lines (the first segment 311 or the second segment 312 of the segment touch control line 31, and the jumper connection lines 313), i.e., the lines can easily bypass outer connectors to connect inner connectors.

In some implementations, in any one of the first region 191 and the second region 192, the array of the main connectors 5 includes seven rows and seven columns, where there are four main connectors 5 in each odd-numbered row, three main connectors 5 in each even-numbered row, four main connectors 5 in each odd-numbered column, and three main connectors 5 in each even-numbered column; in any one of the third region 291 and the fourth region 292, the array of the jumper connectors 6 includes seven rows and seven columns, where there are four jumper connectors 6 in each odd-numbered row, three jumper connectors 6 in each even-numbered row, four jumper connectors 6 in each odd-numbered column, and three jumper connectors 6 in each even-numbered column.

Referring to FIGS. 6, 7, 12, the connectors (the main connectors 5 or the jumper connectors 6) in each region (the first region 191, the second region 192, the third region 291, the fourth region 292) may be arranged in an array having seven rows and seven columns, where there are four connectors in each odd-numbered row/column and three connectors in each even-numbered row/column, i.e., each connector in each even-numbered row/column is located between the connectors in the odd-numbered row/column.

Each region may have a size of 3.84 mm*3.84 mm; in a same region, the distance (based on the distance between centers of circles) between the two connectors farthest from each other in the row/column direction may range from 2.54 mm to 2.79 mm, which may have an error of ±0.05 mm.

In some implementations, the display panel 9 is an organic light emitting diode display panel; the display structure 91 of the organic light emitting diode display panel includes a plurality of organic light emitting diodes.

As a mode of the embodiment of the present disclosure, the display panel 9 may be an organic light emitting diode (OLED) display panel 9; accordingly, the display structure 91 thereof includes a plurality of organic light emitting diodes for emitting light.

Certainly, each organic light emitting diode has a positive electrode and a negative electrode (or a cathode and an anode), respectively.

In some implementations, in the first display terminals 812, there are a plurality of first positive display terminals for supplying power to positive electrodes of the organic light emitting diodes and a plurality of first negative display terminals for supplying power to negative electrodes of the organic light emitting diodes; the second display terminals 822 electrically coupled with the first positive display terminals are second positive display terminals, and the second display terminals 822 electrically coupled with the first negative display terminals are second negative display terminals; the display line 33 includes a plurality of positive lines 338 coupled to the second positive display terminals and a plurality of negative lines 339 coupled to the second negative display terminals.

Corresponding to the organic light emitting diode display panel, the second display terminals 822 of the main circuit board 1 include the second positive display terminals for supplying power to the positive electrodes of the organic light emitting diodes and the second negative display terminals for supplying power to the negative electrodes of the organic light emitting diodes. Accordingly, the display lines 33 of the main circuit board 1 include a plurality of positive lines 338 (ELVDD) for supplying power to the positive electrodes of the organic light emitting diodes, and a plurality of negative lines 339 (ELVSS) for supplying power to the negative electrodes of the organic light emitting diodes.

Referring to FIG. 11, a current flowing through each of the positive lines 338 and the negative lines 339 is relatively large; and thus, each of the positive lines 338 and the negative lines 339 may be coupled to a plurality of corresponding ones of the display terminals (the second positive display terminals, the second negative display terminals), i.e., electrode lines (the positive lines 338 and the negative lines 339) may be relatively "thick" to avoid short-circuiting and the like.

In addition, the lead lines in the display panel 9 corresponding to the positive lines 338 and the negative lines 339 may not pass through the panel chip 55.

Along the first direction, in the second display terminals 822 in the second bonding region 199, the second display terminal 822 corresponding to a high frequency signal (e.g., corresponding to a signal of the data line 521) may be located at middle, and the second display terminals 822 (e.g., the second positive display terminals, the second negative display terminals) for providing other relatively low frequency signals or a constant signal may be located at two ends.

In some implementations, the display structure 91 of the organic light emitting diode display panel further includes an encapsulation layer covering each organic light emitting diode; the touch control structure 92 is disposed on a side of the encapsulation layer away from the substrate and is electrically coupled to the first touch control terminals 811; a polarizer 93 is arranged on a side of the touch control structure 92 away from the substrate; a cover plate 94 is provided on a side of the polarizer 93 away from the substrate.

Referring to FIG. 1, for the OLED display panel, the OLEDs may be encapsulated by the encapsulation layer, and the corresponding touch control structure 92 may then be fabricated on the encapsulation layer, and the touch control structure 92 is electrically coupled to the first touch control terminals 811 in the first bonding region 99 through a structure such as a touch through hole 519.

Further, the polarizer 93 for reducing reflected light is disposed on the side of the touch control structure 92 away from the substrate, and the cover plate 94 (e.g., a glass plate) for protecting other structures is disposed on the side of the polarizer 93 away from the substrate.

Certainly, it should be understood that the above structure is only an example of the structure of the display panel 9, and is not a specific limitation on a form of the display panel 9.

In some implementations, a thickness of each of the first touch control terminals 811 is less than a thickness of the display structure 91; a thickness of each of the first display terminals 812 is less than the thickness of the display structure 91.

The thickness of a structure refers to its largest dimension in the direction perpendicular to the substrate.

As mentioned above, a plurality of metal layers are included in each of the display structure 91 and the touch control structure 92, and each "terminal" may be formed by stacking one or more of the metal layers, but a total thickness of the "terminal" should not exceed the thickness of the display structure 91 or not reach the touch control structure 92.

In some implementations, the display panel 9 includes data lines 521 and panel touch control lines 51 for introducing touch signals into the first touch control terminals 811 respectively, and there is a first distance between the panel touch control lines 51 and the data lines 521 in a direction perpendicular to the substrate; there is a second distance between the jumper connection lines 313 in the jumper connection circuit board 2 and the display lines 33 in the main circuit board 1 in a direction perpendicular to the jumper connection circuit board 2; the first distance is different from the second distance.

In some implementations, the first distance is less than the second distance.

In the display panel 9, the panel touch control lines 51 and the data lines 521 may be located in different layers so that there is a certain distance (the first distance) therebetween in the direction perpendicular to the substrate; in the circuit board assembly Z, the display lines 33 and the jumper connection lines 313 (corresponding to a portion of the touch control lines) overlap each other, so that there is a certain distance (the second distance) between the display lines and the jumper connection lines in the direction perpendicular to the substrate, in such case, the first distance is different from the second distance, for example, the first distance is less than the second distance.

This is because there are many other conductive structures (e.g., the positive electrodes and negative electrodes of the organic light emitting diodes) in the display panel 9 that can shield the signals between the panel touch control lines 51 and the data lines 521 to some extent, thereby reducing interference; there is no other structure between the jumper connection lines 313 and the display lines 33, and thus the distance between the jumper connection lines 313 and the display lines 33 should be relatively large to avoid interference.

In some implementations, the display panel 9 includes the data lines 521; the display lines 33 of the main circuit board 1 include the data display lines 331 for supplying signals to the data lines 521; the number of data lines 521 is greater than the number of data display lines 331.

As described above, the display panel 9 has the data lines 521, so that the display lines 33 of the main circuit board 1 include the data display lines 331 for providing signals to the data lines 521, and since the panel chip 55 is provided, the number of the data display lines 331 is less than the number of the data lines 521, i.e., more data lines 521 can be provided with signals by fewer data display lines 331 (for example, one data display line 331 provides signals to a plurality of data lines 521 in turn).

In some implementations, a width of each of the data lines 521 is less than a width of each of the data display lines 331.

As mentioned above, since the number of the data display lines 331 is relatively small, the width of each of the data display lines 331 can be relatively large.

In a second aspect, referring to FIGS. 1 to 16, the present disclosure provides a display apparatus including a display panel 9 and a circuit board assembly Z including a main circuit board 1 and a jumper connection circuit board 2; the display panel 9 includes a substrate, a display structure 91 disposed on the substrate, and a touch control structure 92 disposed on a side of the display structure 91 away from the substrate; the display panel 9 has a first bonding region 99, and the first bonding region 99 is provided with a plurality of first display terminals 812 electrically coupled to the display structure 91 and a plurality of first touch control terminals 811 electrically coupled to the touch control structure 92; the display panel 9 includes a panel chip 55; the main circuit board 1 has a second bonding region 199, a connection region 193, a first region 191, and a second region 192; the second bonding region 199 is bonded to the first bonding region 99, and the second bonding region 199 has a plurality of second display terminals 822 electrically coupled to the first display terminals 812, respectively, and a plurality of second touch control terminals 821 electrically coupled to the first touch control terminals 811, respectively; a plurality of main connectors 5 are respectively arranged in the first region 191 and the second region 192; the main circuit board 1 includes a touch control chip 4, a plurality of display lines 33 and a plurality of segment touch control lines 31; each segment touch control line 31 includes the first segment 311 and the second segment 312, where the first segment 311 is coupled between one of the second touch control terminals 821 and one of the main connectors 5 in the first region 191, and the second segment 312 is coupled between the touch control chip 4 and one of the main connectors 5 in the second region 192; at least a portion of the display lines 33 are coupled between the second display terminals 822 and the connection region 193, and intersect with a line connected between the first region 191 and the second region 192; the jumper connection circuit board 2 has a third region 291 and a fourth region 292; the third region 291 is bonded to the first region 191, and the fourth region 292 is bonded to the second region 192; a plurality of jumper connectors 6 electrically coupled to the main connectors 5 in the first region 191 respectively are provided in the third region 291, and a plurality of jumper connectors 6 electrically coupled to the main connectors 5 in the second region 192 respectively are provided in the fourth region 292; the jumper connection circuit board 2 includes a plurality of jumper connection lines 313 corresponding to the segment touch control lines 31 one to one; each jumper connection line 313 is coupled between one of the jumper connectors 6 in the third region 291 and one of the jumper connectors 6 in the fourth region 292, and two of the main connectors 5 electrically coupled to such two jumper connectors 6 are respectively coupled to the first segment 311 and the second segment 312 of one of the segment touch control lines 31; the main circuit board 1 is a flexible circuit board; the jumper connection circuit board 2 is a flexible circuit board; the jumper connection circuit board 2 includes a first base layer, and a first conductive layer and a second conductive layer are respectively arranged on two sides of the first base layer; each jumper connector 6 includes a first contact part 691 provided in the first conductive layer and a second contact part 692 provided in the second conductive layer, the first contact part 691 and the second contact part 692 being coupled by a connection part 693 in a through hole of the first base layer, the first contact part 691 being farther from the main circuit board 1 than the second contact part 692; a surface of the first contact part 691 away from the first base layer is of a pattern with an opening therein, and a surface of the second contact part 692 away from the first base layer is of a pattern with an opening therein; the connection part 693 is a hollow cylinder; the jumper connector 6 is electrically coupled to the main connector 5 through a soldering structure 7 formed by melting solder in a hollow of the connection part 693; a thickness D1 of a part of the soldering structure 7 between the second contact part 692 and the main connector 5 (i.e., the "soldering part") is greater than any of a thickness d1 of the first contact part 691, a thickness d2 of the second contact part 692, and a thickness d3 of the main connector 5.

In some implementations, the thickness D2 of a part (i.e., "soldering cap") of the soldering structure 7 farther from the main circuit board 1 than the first contact part 691 is less than or equal to 0.05 mm.

In some implementations, the display panel 9 includes the data lines 521; the display lines 33 of the main circuit board 1 include the data display lines 331 for supplying signals to the data lines 521; a width of each of the data lines 521 is less than that of each of the data display lines 331.

In some implementations, the display panel 9 includes the data lines 521 and the panel touch control lines 51 for introducing touch signals into the first touch control terminals 811 respectively, and there is a first distance between the panel touch control lines 51 and the data lines 521 in a direction perpendicular to the substrate; there is a second distance between the jumper connection lines 313 in the jumper connection circuit board 2 and the display lines 33 in the main circuit board 1 in a direction perpendicular to the jumper connection circuit board 2; the first distance is different from the second distance.

In some implementations, the jumper connectors 6 coupled to the jumper connection lines 313 are active connectors 61; the jumper connection line panel 2 further includes a shielding ring 251, the shielding ring 251 surrounding the jumper connection lines 313 and the active connectors 61.

In some implementations, the display panel 9 is an organic light emitting diode display panel; the display structure 91 of the organic light emitting diode display panel includes a plurality of organic light emitting diodes; the first display terminals 812 include a plurality of first positive display terminals for supplying power to positive electrodes of the organic light emitting diodes, and a plurality of first negative display terminals for supplying power to negative electrodes of the organic light emitting diodes; the second display terminals 822 electrically coupled with the first positive display terminals are second positive display terminals, and the second display terminals 822 electrically coupled with the first negative display terminals are second negative display terminals; the display lines 33 include a plurality of positive lines 33 coupled to the second positive display terminals and a plurality of negative lines 339 coupled to the second negative display terminals.

Figure 17:
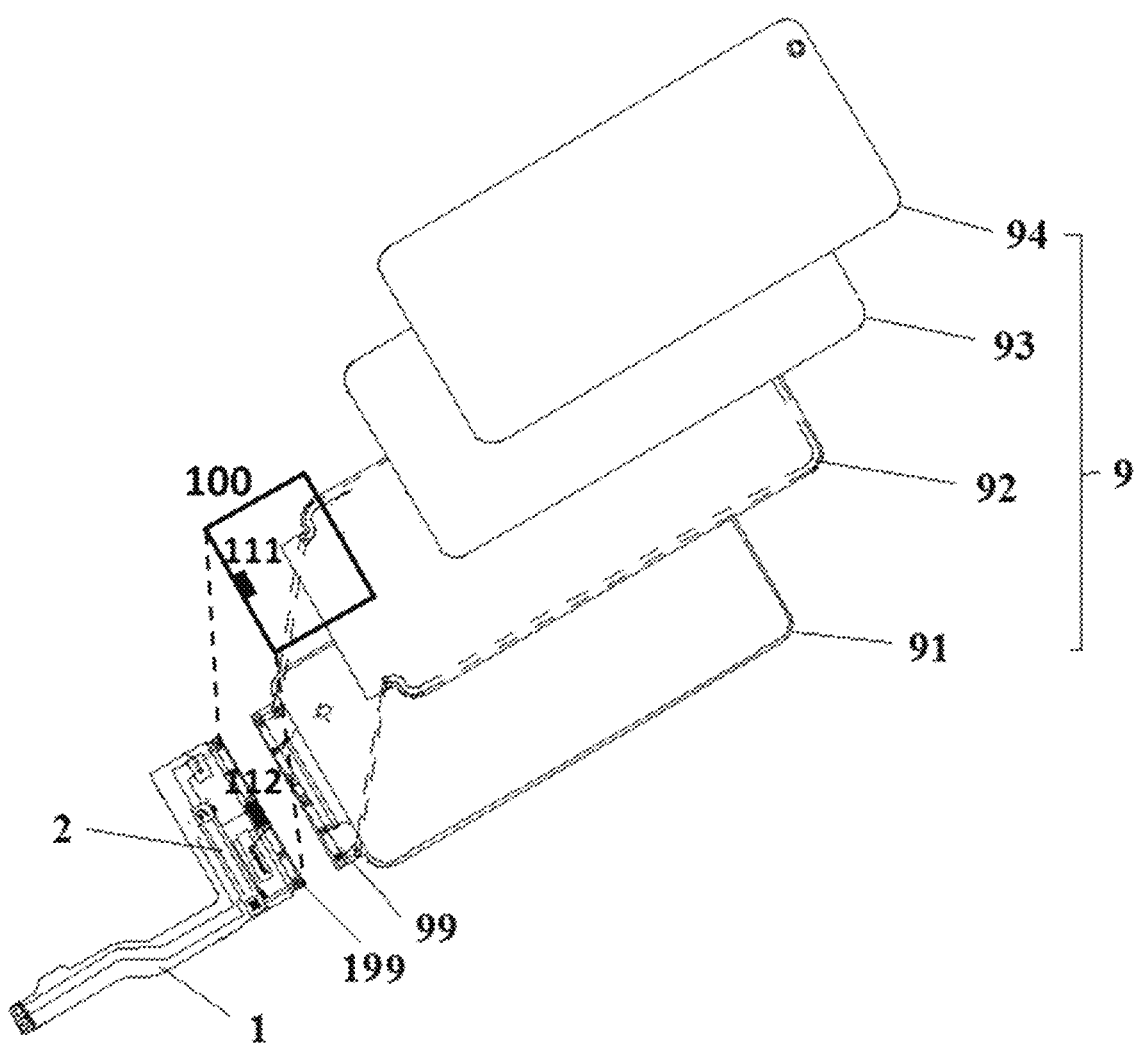
FIG. 17 is a schematic diagram of an explosive decomposition structure of a display apparatus according to an embodiment of the present disclosure (a main circuit board and a jumper connection circuit board are not separated).

The above only provides a detailed explanation of the technical solution of the present disclose by taking the display apparatus with a touch function as an example. In fact, the display apparatus of the present disclosure may have other functions. For example, the display apparatus may have at least one of a touch function, a fingerprint identification function, a near-field communication (NFC) function, a pressure sensing function, or a health data (such as data relating to a heart rate, a blood pressure, etc.) collection function. Correspondingly, the touch control structure 92 mentioned above may be replaced by a fingerprint identification structure, a near-field communication (NFC) structure, a pressure sensing structure, or a health data collection structure. Alternatively, on the basis of including the touch control structure 92, the display apparatus of the present disclosure may also include at least one of the fingerprint identification structure, the near-field communication (NFC) structure, the pressure sensing structure, or the health data collection structure, as a functional structure 100, as shown in FIG. 17. Accordingly, the touch control chip 4 mentioned above may be replaced by a control chip for controlling the fingerprint identification structure, a control chip for controlling the near-field communication (NFC) structure, a control chip for controlling the pressure sensing structure, or a control chip for controlling the health data control structure. Alternatively, on the basis of including the touch control chip 4, in the display apparatus of the present disclosure, the main circuit board 1 mentioned above may also include at least one of the control chip for controlling the fingerprint identification structure, the control chip for controlling the near-field communication (NFC) structure, the control chip for controlling the pressure sensing structure, or the control chip for controlling the health data collection structure, as a control chip for controlling the functional structure 100. The control chip for controlling the functional structure 100 may be integrated with the touch control chip 4, or may be separated from the touch control chip 4 but located in the same area as the touch control chip 4, which is not limited here.

It should be noted that the fingerprint identification structure, the near-field communication (NFC) structure, the pressure sensing structure, and/or the health data collection structure may be integrated into the display panel 9 mentioned above, or may be provided to be separated from the display panel 9, which is not limited here.

In addition, each of the fingerprint identification structure, the near-field communication (NFC) structure, the pressure sensing structure, and the health data collection structure may be electrically connected to the control chip corresponding thereto through a connection terminal in the first bonding region 99 mentioned above and a connection terminal in the second bonding region 199 mentioned above, or may be connected to the control chip corresponding thereto through a connection terminal 111, serving as a part of a plug-in connector (such as B2B connector, ZIF connector, etc.), on itself, and a connection terminal 112, serving as a part of the plug-in connector, on the main circuit board 1 mentioned above, as shown in FIG. 17, which is not limited here.

It should be noted that, in a case where the touch control structure 92 mentioned above is replaced by the fingerprint identification structure, the near-field communication (NFC) structure, the pressure sensing structure, or the health data collection structure, the touch control chip 4 mentioned above may be correspondingly replaced by the control chip for controlling the fingerprint identification structure, the control chip for controlling the near-field communication (NFC) structure, the control chip for controlling the pressure sensing structure, or the control chip for controlling the health data collection structure, and accordingly, the touch control lines, the touch control terminals, the touch signals or the like mentioned above may also be replaced by corresponding control lines, corresponding connection terminals, and corresponding control signals or the like, respectively, which are not elaborated here.

Similarly, in a case where, in addition to the touch control structure 92 mentioned above, the display apparatus of the present disclosure further includes at least one of the fingerprint identification structure, the near-field communication (NFC) structure, the pressure sensing structure, and the health data acquisition structure, as the functional structure 100, the control lines, the connection terminals, the control signals or the like for the functional structure 100 may also be provided and configured similarly to the touch control lines, the touch control terminals, the touch signals or the like mentioned above, respectively, which are not detailed here.

Moreover, it should be understood by ordinary skills in the art that, the fingerprint identification structure, the near-field communication (NFC) structure, the pressure sensing structure, the health data collection structure, and control chips corresponding thereto, may be implemented by using existing technologies or improved technologies without departing from the present disclosure, which is not limited here.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

The invention claimed is:

1. A display apparatus, comprising a display panel, a circuit board assembly and a first functional structure, wherein the circuit board assembly comprises a main circuit board and a jumper connection circuit board;

the display panel comprises a substrate, a display structure arranged on the substrate; the display panel has a first bonding region, and a plurality of first display terminals electrically coupled with the display structure are arranged in the first bonding region;

the main circuit board has a second bonding region, a connection region, a first region and a second region; the second bonding region is bonded with the first bonding region, and a plurality of second display terminals electrically coupled with the first display terminals respectively are arranged in the second bonding region; a plurality of main connectors are respectively arranged in the first region and the second region;

the main circuit board comprises a control chip for controlling the first functional structure, a plurality of display lines, a plurality of segment control lines, and a first connection terminal electrically connected with the first functional structure; each of the segment control lines comprises a first segment and a second segment, wherein the first segment is coupled between the first connection terminal and one of the main connectors in the first region, and the second segment is coupled between the control chip and one of the main connectors in the second region; at least a portion of the display lines are coupled between the second display terminals and the connection region and are crossed with a line connected between the first region and the second region;

the jumper connection circuit board has a third region and a fourth region; the third region is bonded with the first region, and the fourth region is bonded with the second region; a plurality of jumper connectors electrically coupled with the main connectors in the first region respectively are arranged in the third region, and a plurality of jumper connectors electrically coupled with the main connectors in the second region respectively are arranged in the fourth region;

the jumper connection circuit board comprises a plurality of jumper connection lines which correspond to the segment control lines one by one; each jumper connection line is coupled between one of the jumper connectors in the third region and one of the jumper connectors in the fourth region, and two of the main connectors electrically coupled with such two jumper connectors are respectively coupled with the first segment and the second segment of one of the segment control lines;

the main circuit board is a flexible circuit board; the jumper connection circuit board is a flexible circuit board.

2. The display apparatus according to claim 1, wherein the first connection terminal is arranged in the second bonding region, a second connection terminal electrically connected with the first functional structure is arranged in the first bonding region, and the first functional structure is electrically connected with the first connection terminal through the second connection terminal;

or, the second connection terminal is arranged on the first functional structure, and the first functional structure is electrically connected with the first connection terminal through the second connection terminal.

3. The display apparatus according to claim 1, wherein the first functional structure is integrated in the display panel, or separated from the display panel, the first functional structure is at least one of a touch control structure, a fingerprint identification structure, a near-field communication structure, a pressure sensing structure, or a health data collection structure.

4. The display apparatus according to claim 1, wherein the jumper connectors coupled with the jumper connection lines are active connectors;

the jumper connection circuit board further comprises a shielding ring, and the shielding ring surrounds the jumper connection lines and the active connectors.

5. The display apparatus according to claim 4, wherein the jumper connectors in the third region comprise at least one shielding connector coupled with the shielding ring, the jumper connectors in the fourth region comprise at least one shielding connector coupled to the shielding ring;

or, the jumper connectors in the third region comprise at least one ground connector coupled with a ground terminal, the jumper connectors in the fourth region comprise at least one ground connector coupled to the ground terminal;

or, the jumper connectors in the third region comprise at least one floating connector floating, the jumper connectors in the fourth region comprise at least one floating connector floating.

6. The display apparatus according to claim 1, wherein the jumper connection circuit board comprises a first base layer, wherein a first conductive layer and a second conductive layer are respectively arranged on two sides of the first base layer;

each of the jumper connectors comprises a first contact part arranged in the first conductive layer and a second contact part arranged in the second conductive layer, and the first contact part and the second contact part are coupled through a connection part in a through hole of the first base layer.

7. The display apparatus according to claim 6, wherein a surface of the first contact part away from the first base layer is of a pattern with an opening therein, and a surface of the second contact part away from the first base layer is of a pattern with an opening therein;

the connection part is a hollow cylinder; the jumper connector is electrically coupled with the main connector through a soldering structure formed by melting solder in a hollow of the connection part.

8. The display apparatus according to claim 7, wherein the first contact part is farther away from the main circuit board than the second contact part, a thickness of a part of the soldering structure between the second contact part and the main connector is greater than a thickness of any one of the first contact part, the second contact part and the main connector.

9. The display apparatus according to claim 7, wherein the surface of the first contact part away from the first base layer has a shape of a circular ring, the surface of the second contact part away from the first base layer has a shape of the circular ring, the connection part is hollow cylindrical, and a surface of the main connector proximal to the first base layer has a shape of a circle;

or, an outer edge of the surface of the first contact part away from the first base layer has a shape of a circle, an outer edge of the surface of the second contact part away from the first base layer has a shape of a circle, the opening in the pattern of the surface of the first contact part away from the first base layer is in a shape formed by two strips intersecting with each other, and the opening in the pattern of the surface of the second contact part away from the first base layer is in a shape formed by two strips intersecting with each other.

10. The display apparatus according to claim 7, wherein an outer edge of the surface of the first contact part away from the first base layer is different from an outer edge of the surface of the second contact part away from the first base layer in dimension.

11. The display apparatus according to claim 6, wherein a portion of the jumper connection lines are arranged in the first conductive layer, the rest of the jumper connection lines are arranged in the second conductive layer, the first conductive layer is provided with at least one shielding mesh, and the second conductive layer is provided with at least one shielding mesh;

or, the jumper connection lines are all arranged in the first conductive layer, a shielding layer is provided in the second conductive layer at least at positions corresponding to the jumper connection lines, and the second conductive layer is closer to the main circuit board than the first conductive layer.

12. The display apparatus according to claim 1, wherein a part of the jumper connection circuit board provided with the third region and a part of the jumper connection circuit board provided with the fourth region are of an asymmetric structure.

13. The display apparatus according to claim 1, wherein the main circuit board further comprises a plurality of direct-connection control lines, and each direct-connection control lines is coupled between the control chip and the first connection terminal, the display panel comprises a plurality of panel control lines for introducing control signals into the first functional structure;

the number of the panel control lines is equal to a sum of the number of the segment control lines and the number of the direct-connection control lines.

14. The display apparatus according to claim 1, wherein the main circuit board comprises a second base layer, and a third conductive layer and a fourth conductive layer are arranged on two sides of the second base layer respectively, the display lines are all arranged in the fourth conductive layer, a shielding structure is provided in the third conductive layer at least at positions corresponding to the display lines, and the third conductive layer is closer to the jumper connection circuit board than the fourth conductive layer; and/or the segment control lines are all arranged in one of the third conductive layer and the fourth conductive layer, or, a portion of the segment control lines are arranged in the third conductive layer, and the rest of the segment control lines are arranged in the fourth conductive layer.

15. The display apparatus according to claim 1, wherein the main circuit board has a device region;

in the device region, a plurality of devices are arranged on a side of the main circuit board;

the control chip is arranged on a side of the main circuit board provided with a device in the device region;

in the device region, a metal supporting layer is arranged on another side of the main circuit board, which is opposite to the side provided with the device, wherein a boundary of an orthographic projection of the metal supporting layer on the main circuit board exceeds a boundary of the device region.

16. The display apparatus according to claim 1, wherein in any one of the first region and the second region, the main connectors are arranged in an array, any two of the main connectors in different rows in any two adjacent rows of the array are at different positions in a row direction, and any two of the main connectors in different columns in any two adjacent columns of the array are at different positions in a column direction;

in any one of the third region and the fourth region, the jumper connectors are arranged in an array, any two of the jumper connectors in different rows in any two adjacent rows of the array are at different positions in the row direction, and any two of the jumper connectors in different columns in any two adjacent columns of the array are at different positions in the column direction.

17. The display apparatus according to claim 1, wherein the display panel is an organic light emitting diode display panel; the display structure of the organic light emitting diode display panel comprises a plurality of organic light emitting diodes;

the first display terminals comprise a plurality of first positive display terminals for supplying power to positive electrodes of the organic light emitting diodes and a plurality of first negative display terminals for supplying power to negative electrodes of the organic light emitting diodes; the second display terminals electrically coupled with the first positive display terminals are second positive display terminals, and the second display terminals electrically coupled with the first negative display terminals are second negative display terminals;

the display lines comprise a plurality of positive lines coupled with the second positive display terminals and a plurality of negative lines coupled with the second negative display terminals.

18. The display apparatus according to claim 1, wherein a thickness of each of the first display terminals is less than that of the display structure.

19. The display apparatus according to claim 1, wherein the display panel comprises data lines and panel control lines for introducing control signals into the first functional structure, and there is a first distance between the panel control lines and the data lines in a direction perpendicular to the substrate;

there is a second distance between the jumper connection lines in the jumper connection circuit board and the display lines in the main circuit board in a direction perpendicular to the jumper connection circuit board, the first distance is less than the second distance.

20. The display apparatus according to claim 1, wherein the display panel comprises data lines;

the display lines of the main circuit board comprise data display lines for providing signals for the data lines;

the number of the data lines is greater than the number of the data display lines.

* * * * *